(12) United States Patent
Cordingley et al.

(10) Patent No.: US 7,394,476 B2
(45) Date of Patent: *Jul. 1, 2008

(54) METHODS AND SYSTEMS FOR THERMAL-BASED LASER PROCESSING A MULTI-MATERIAL DEVICE

(75) Inventors: James J. Cordingley, Littleton, MA (US); Jonathan S. Ehrmann, Sudbury, MA (US); Joseph J. Griffiths, Winthrop, MA (US); Shepard D. Johnson, Andover, MA (US); Joohan Lee, Andover, MA (US); Donald V. Smart, Boston, MA (US); Donald J. Svetkoff, Ann Arbor, MI (US)

(73) Assignee: GSI Group Corporation, Billerica, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/415,547

(22) Filed: May 2, 2006

(65) Prior Publication Data
US 2006/0192845 A1    Aug. 31, 2006

Related U.S. Application Data

(63) Continuation of application No. 10/107,890, filed on Mar. 27, 2002.

(60) Provisional application No. 60/279,644, filed on Mar. 29, 2001.

(51) Int. Cl.
*B41J 2/435* (2006.01)
*B23K 26/00* (2006.01)

(52) U.S. Cl. .................................. 347/224; 219/121.6

(58) Field of Classification Search .............. 129/121.6; 347/224–225; 219/121.6–121.62, 121.67–121.69
See application file for complete search history.

(56) References Cited

U.S. PATENT DOCUMENTS 3,806,829 A    4/1974   Duston et al.

(Continued)

FOREIGN PATENT DOCUMENTS

EP    0 367 507 A2    5/1990

(Continued)

OTHER PUBLICATIONS

Bernstein, Joseph B., et al., Laser Energy Limitation For Buried Metal Cuts, IEEE Electron Device Letters, Jan. 1998, pp. 1-5, vol. 19, No. 1, College Park, Maryland.

(Continued)

*Primary Examiner*—Hai C Pham
(74) *Attorney, Agent, or Firm*—Knobbe Martens Olson & Bear LLP

(57) ABSTRACT

A method and system for locally processing a predetermined microstructure formed on a substrate without causing undesirable changes in electrical or physical characteristics of the substrate or other structures formed on the substrate are provided. The method includes providing information based on a model of laser pulse interactions with the predetermined microstructure, the substrate and the other structures. At least one characteristic of at least one pulse is determined based on the information. A pulsed laser beam is generated including the at least one pulse. The method further includes irradiating the at least one pulse having the at least one determined characteristic into a spot on the predetermined microstructure. The at least one determined characteristic and other characteristics of the at least one pulse are sufficient to locally process the predetermined microstructure without causing the undesirable changes.

35 Claims, 14 Drawing Sheets

U.S. PATENT DOCUMENTS

| | | | |
|---|---|---|---|
| 3,869,210 A | 3/1975 | Fletcher et al. |
| 4,044,222 A | 8/1977 | Kestenbaum |
| 4,114,018 A | 9/1978 | Allmen et al. |
| 4,399,345 A | 8/1983 | Lapham |
| 4,414,059 A | 11/1983 | Blum et al. |
| 4,467,172 A | 8/1984 | Ehrenwald et al. |
| 4,483,005 A | 11/1984 | Smart |
| 4,532,402 A | 7/1985 | Overbeck |
| 4,602,852 A | 7/1986 | Moroz |
| 4,646,308 A | 2/1987 | Kafka et al. |
| 4,742,522 A | 5/1988 | Linford |
| 4,780,177 A | 10/1988 | Wojnarowski et al. |
| 4,826,785 A | 5/1989 | McClure et al. |
| 4,827,325 A | 5/1989 | Or-Bach et al. |
| 4,878,222 A | 10/1989 | Lawrence |
| 4,914,663 A | 4/1990 | Basu et al. |
| 4,932,031 A | 6/1990 | Alfano et al. |
| 4,935,801 A | 6/1990 | McClure et al. |
| 5,005,946 A | 4/1991 | Brandstetter |
| 5,021,362 A | 6/1991 | Chlipala |
| 5,034,951 A | 7/1991 | Edelstein et al. |
| 5,042,040 A | 8/1991 | Harvey et al. |
| 5,059,764 A | 10/1991 | Baer |
| 5,175,664 A | 12/1992 | Diels et al. |
| 5,197,074 A | 3/1993 | Emmons, Jr. et al. |
| 5,201,437 A | 4/1993 | Burgdorf |
| 5,208,437 A | 5/1993 | Miyauchi et al. |
| 5,236,551 A | 8/1993 | Pan |
| 5,265,114 A | 11/1993 | Sun et al. |
| 5,268,911 A | 12/1993 | Young |
| 5,280,491 A | 1/1994 | Lai |
| 5,293,025 A | 3/1994 | Wang |
| 5,294,567 A | 3/1994 | Dorfman et al. |
| 5,300,756 A | 4/1994 | Cordingley |
| 5,329,152 A | 7/1994 | Janai et al. |
| 5,400,350 A | 3/1995 | Galvanauskas |
| 5,451,785 A | 9/1995 | Faris |
| 5,473,624 A | 12/1995 | Sun |
| 5,475,527 A | 12/1995 | Hackel et al. |
| 5,513,194 A | 4/1996 | Tamura et al. |
| 5,520,679 A | 5/1996 | Lin |
| 5,539,764 A | 7/1996 | Shields et al. |
| 5,558,789 A | 9/1996 | Singh |
| 5,569,398 A | 10/1996 | Sun et al. |
| 5,586,138 A | 12/1996 | Yokogama |
| 5,592,327 A | 1/1997 | Gal et al. |
| 5,627,848 A | 5/1997 | Fermann et al. |
| 5,653,900 A | 8/1997 | Clement et al. |
| 5,654,998 A | 8/1997 | Turcu et al. |
| 5,656,186 A | 8/1997 | Mourou et al. |
| 5,662,822 A | 9/1997 | Tada et al. |
| 5,669,979 A | 9/1997 | Elliott et al. |
| 5,685,995 A | 11/1997 | Sun et al. |
| 5,689,519 A | 11/1997 | Fermann et al. |
| 5,694,408 A | 12/1997 | Bott et al. |
| 5,720,894 A | 2/1998 | Neev et al. |
| 5,725,914 A | 3/1998 | Opower |
| 5,739,590 A | 4/1998 | Sakamoto et al. |
| 5,742,634 A | 4/1998 | Rieger et al. |
| 5,745,284 A | 4/1998 | Goldberg et al. |
| 5,751,585 A | 5/1998 | Cutler et al. |
| 5,759,428 A | 6/1998 | Balamane et al. |
| 5,786,560 A | 7/1998 | Tatah et al. |
| 5,790,574 A | 8/1998 | Rieger et al. |
| 5,811,751 A | 9/1998 | Leong et al. |
| 5,818,630 A | 10/1998 | Fermann et al. |
| 5,837,962 A | 11/1998 | Overbeck |
| 5,841,099 A | 11/1998 | Owen et al. |
| 5,847,960 A | 12/1998 | Cutler et al. |
| 5,848,080 A | 12/1998 | Dahm |
| 5,864,430 A | 1/1999 | Dickey et al. |
| 5,880,877 A | 3/1999 | Fermann et al. |
| 5,923,686 A | 7/1999 | Fermann et al. |
| 5,925,271 A | 7/1999 | Pollack et al. |
| 5,940,418 A | 8/1999 | Shields |
| 5,953,354 A | 9/1999 | Staver et al. |
| 5,956,354 A | 9/1999 | Yan |
| 5,974,060 A | 10/1999 | Byren et al. |
| 5,987,049 A | 11/1999 | Weingarten et al. |
| 5,998,759 A | 12/1999 | Smart |
| 6,025,256 A | 2/2000 | Swenson et al. |
| 6,034,975 A | 3/2000 | Harter et al. |
| 6,057,180 A | 5/2000 | Sun et al. |
| 6,072,811 A | 6/2000 | Fermann et al. |
| 6,103,992 A | 8/2000 | Noddin |
| 6,144,118 A | 11/2000 | Cahill et al. |
| 6,150,630 A | 11/2000 | Perry |
| 6,151,338 A | 11/2000 | Grubb et al. |
| 6,156,030 A | 12/2000 | Neev |
| 6,169,014 B1 | 1/2001 | McCulloch |
| 6,172,325 B1 | 1/2001 | Baird et al. |
| 6,181,728 B1 | 1/2001 | Cordingley et al. |
| 6,191,486 B1 | 2/2001 | Bernstein |
| 6,208,458 B1 | 3/2001 | Galvanauskas et al. |
| 6,210,401 B1 | 4/2001 | Lai |
| 6,211,485 B1 | 4/2001 | Burgess |
| 6,239,406 B1 | 5/2001 | Onoma et al. |
| 6,252,195 B1 | 6/2001 | Mosavi et al. |
| 6,268,586 B1 | 7/2001 | Stuart et al. |
| 6,281,471 B1 | 8/2001 | Smart |
| 6,285,002 B1 | 9/2001 | Ngoi et al. |
| 6,297,541 B1 | 10/2001 | Ema et al. |
| 6,300,590 B1 | 10/2001 | Lauer et al. |
| 6,339,604 B1 | 1/2002 | Smart |
| 6,340,806 B1 | 1/2002 | Smart et al. |
| 6,341,029 B1 | 1/2002 | Fillion et al. |
| RE37,585 E | 3/2002 | Mourou et al. |
| 6,421,166 B1 | 7/2002 | Velsko |
| 6,433,301 B1 | 8/2002 | Dunsky et al. |
| 6,441,337 B1 | 8/2002 | Isaji et al. |
| 6,462,306 B1 | 10/2002 | Kitai |
| 6,472,295 B1 | 10/2002 | Morris et al. |
| 6,483,071 B1 | 11/2002 | Hunter et al. |
| 6,541,731 B2 | 4/2003 | Mead et al. |
| 6,552,301 B2 | 4/2003 | Herman et al. |
| 6,574,250 B2 | 6/2003 | Sun et al. |
| 6,580,055 B2 | 6/2003 | Iso |
| 6,593,542 B2 | 7/2003 | Baird et al. |
| 6,621,040 B1 | 9/2003 | Perry et al. |
| 6,664,498 B2 | 12/2003 | Forsman et al. |
| 6,689,985 B2 | 2/2004 | Lipman et al. |
| 6,710,289 B2 | 3/2004 | Iso |
| 6,717,101 B2 | 4/2004 | Morris et al. |
| 6,727,458 B2 | 4/2004 | Smart |
| 6,816,294 B2 | 11/2004 | Unrath et al. |
| 6,849,824 B2 | 2/2005 | Arai |
| 6,875,951 B2 | 4/2005 | Sakamoto et al. |
| 6,879,605 B2 | 4/2005 | Kyusho et al. |
| 6,901,090 B1 | 5/2005 | Ohtsuki |
| 6,947,123 B1 | 9/2005 | Ohtsuki |
| 6,951,995 B2 | 10/2005 | Couch |
| 6,972,268 B2 | 12/2005 | Ehrmann et al. |
| 6,989,508 B2 | 1/2006 | Ehrmann et al. |
| 7,050,208 B2 | 5/2006 | Overbeck |
| 2001/0009250 A1 | 7/2001 | Herman et al. |
| 2001/0022673 A1 | 9/2001 | Sato et al. |
| 2001/0045419 A1 | 11/2001 | Dunsky et al. |
| 2001/0050931 A1 | 12/2001 | Iso |
| 2002/0003130 A1 | 1/2002 | Sun et al. |
| 2002/0005396 A1 | 1/2002 | Baird et al. |
| 2002/0009843 A1 | 1/2002 | Kyusho et al. |
| 2002/0050488 A1 | 5/2002 | Nikitin et al. |
| 2002/0063361 A1 | 5/2002 | Fahey |
| 2002/0131693 A1 | 9/2002 | Islam et al. |

| | | | |
|---|---|---|---|
| 2003/0042230 A1 | 3/2003 | Gross et al. | |
| 2003/0058440 A1 | 3/2003 | Scott et al. | |
| 2003/0151053 A1 | 8/2003 | Sun et al. | |
| 2003/0222324 A1 | 12/2003 | Sun et al. | |
| 2004/0057475 A1 | 3/2004 | Frankel et al. | |
| 2004/0228004 A1 | 11/2004 | Sercel et al. | |
| 2005/0041702 A1 | 2/2005 | Fermann et al. | |

FOREIGN PATENT DOCUMENTS

| | | |
|---|---|---|
| EP | 0902 474 A2 | 3/1999 |
| GB | 2 331 038 A | 5/1999 |
| JP | H2-137682 | 5/1980 |
| JP | 55-081095 | 6/1980 |
| JP | 56-143434 | 9/1981 |
| JP | 56-143434 | 11/1981 |
| JP | 62-086839 | 4/1987 |
| JP | 63-136545 | 6/1988 |
| JP | 63-264286 | 11/1988 |
| JP | 63-302503 | 12/1988 |
| JP | 64-044295 | 2/1989 |
| JP | 02-089586 | 11/1989 |
| JP | 01-289586 | 3/1990 |
| JP | 02-063103 | 3/1990 |
| JP | 03-297588 | 12/1991 |
| JP | 04-098801 | 3/1992 |
| JP | 04-006599 | 8/1993 |
| JP | 05-235169 | 9/1993 |
| JP | 06142968 | 5/1994 |
| JP | 2531453 | 6/1996 |
| JP | 63005891 | 1/1998 |
| JP | 10-328873 | 12/1998 |
| JP | 11149317 A | 6/1999 |
| JP | 11-245073 | 9/1999 |
| JP | 02003133690 A | 5/2003 |
| JP | 2003334684 A | 11/2003 |
| WO | WO 96/16484 | 5/1996 |
| WO | WO 98/28104 | 7/1998 |
| WO | WO 98/0031049 | 7/1998 |
| WO | WO 98/42050 | 9/1998 |
| WO | WO 01/87534 | 11/2001 |
| WO | WO 03/047807 A1 | 6/2003 |
| WO | WO 03/052890 A1 | 6/2003 |

OTHER PUBLICATIONS

Damaseus, Novellus, Benefits of Copper—Copper Technology is Here Today in Working Devices, Dec. 20, 2001, pp.

Cacouvis, T. Preventing Cross-Contamination Caused By Copper Diffusion and Other Sources, Micro, Jul./Aug. 1999.

Litwin, et al., Laser Adjustment of Linear Monolithic Circuits, vol. 38 ICAELO, 1983, pp. 1-8.

Scarfone, et al., Computer Simulation of Target Link Explosion in Laser Programmable Redundancy For SiliconMemory, 1986, pp. 368-381.

Boogard, Precision Laser Micromachining, Laser Processing of Semiconductors and Hybrigs, SPIE vol. 611, 1986, pp. 48-59.

Smart, Laser Processing for Application Specific Integrated Circuits (asics), SPIE vol. 774, 1987.

Cohen, Laser Beam Processing and Wafer Scale Integration, Chapter 2, 1988, pp. 84-111.

Sun, et al., Optimization of Memory Redundancy Link Processing, vol. 152, SPIE 2636, 1995.

Bernstein, et al., Analysis of Laser Metal Cut Energy Process Window, IEEE Trans. on Semicond. Manufact. vol. 13, No. 2, 2000.

Smart, Donald, et al., Link Processing With Lasers, Jul. 1998, Semicon West, pp. 1-20.

LIA Handbook of Laser Materials Processing, Link Cutting/Making, Laser Institute of America, 2001, Chapter 19, pp. 595-615.

Muller, Heinrich G., et al., Laser Process For Personalization and Repair of Multi-Chip-Modules, Microelectronics and Commputer Technology Corp., Austin, Manufacturing, 1991, pp. 132-140.

North, James, C., et al., Laser Coding of Bipolar Read-Only Memories, IEEE Journal of Solid-State Circuits, vol. SC-11, No. 4, Aug. 1976.

ESI '347 Claim Chart, pp. 1-92.

Bernstein, Joseph B., et al., Metal Wire Cutting By Repeated Application of Low-Power Laser Pulses, Massachusetts, Feb. 17, 1992, pp. 1-3.

ESI '498 Claim Chart, pp. 1-96.

Ippen, E.P., et al., Picosecond Pulse Generation By Passive Mode Locking of Diode Lasers, Applied Physics Lett 37 (3), Aug. 1, 1980, pp. 267-269.

Zhang, Zhuhong, et al., Gallium Arsenide: A New Material to Accomplish Passively Mode-Locked Nd:YAG Laser, Applied Physics Lett. vol. 60, No. 4, Jan. 27, 1992, pp. 419-421, Shanghai. PRC.

Fluck, R., et al., Passively Q-switched 1.34-$\mu$m Nd:YVO$_4$ Microchip Laser with Semiconductor Saturable-Absorber Mirrors, Optics Letters, vol. 22, No. 13, Jul. 1, 1997, pp. 991-993, Zurich, Switzerland.

Paschotta, R., et al., Passive Mode Locking with Slow Saturable Absorbers, Applied Physics B 73, Lasers and Optics, pp. 653-662, Zurich, Switzerland.

Keller, Ursula, Recent Development in Compact Ultrafast Lasers, Nature vol. 424, Aug. 14, 2003, pp. 831-838.

Hoogland S., et al., Passively Mode-Locked Diode-Pumped Surface-Emitting Semiconductor Laser, IEEE Photonics Technology Letters, vol. 12, No. 9, Sep. 2000, pp. 1135-1137.

Spuhler, G.J., et al., Output-Coupling Semiconductor Saturable Absorber Mirror, Applied Physics Letters, vol. 78, No. 18, Apr. 30, 2001, pp. 2733-2735.

Keller, Ursula, et al., Semiconductor Saturable Absorber Mirrors (SESAM's) For Femtosecond to Nanosecond Pulse Generation in Solid-State Lasers, Journal of Selected Topics in Quantum Electronics, vol. 2, No. 3, Sep. 1996, pp. 435-453.

Fauchet P.M., et al., Surface Ripples on Silicon and Gallium Arsenide Under Picosecond Laser Illumination, Applied Physics Lett. 40(9), May 1, 1982, pp. 824-826, Stanford, California.

Haneman, D., et al., Surface Topography of Laser Annealed Silicon, Solid State Communications, Vo. 43, No. 3, pp. 203-206, 1982, Great Britain.

Shank, C.V., et al., Time-Resolved Reflectivity Measurements of Femtosecond-Optical-Pulse=Induced Phase Transitions in Silicon, Physical Review Letters, vol. 50. No. 6, Feb. 7, 1983, Holmdel, New Jersey, pp. 454-457.

Marine, W., et al., Picosecond YAG Laser Photoablation of Amorphous Silicon, Applied Surface Science 46, 1990, pp. 239-244, France.

Kautek, W., et al., Femtosecond-Pulse Laser Microstructuring of Semiconducting Materials, Materials Science Forum, vols. 173-174, 1995, pp. 17-22, Berlin, Germany.

Kruger, Jorg, et al., Femtosecond-Pulse Laser Processing of Metallic and Semiconducting Thin Films, SPIE, vol. 2403, pp. 436-447.

Stuart, B.C., et al., Ultrashort-Pulse Optical Damage, SPIE, vol. 2714, pp. 616-628, Livermore, California.

Chichov, B.N., et al., Femtosecond, Picosecond and Nanosecond Laser Ablation of Solids, Applied Physics, A 63, 1996, pp. 109-115.

Stuart, B.C., et al., Optical Ablation by High-Power Short-Pulse Lasers, J. Optical Society, vol. 13, No. 2, Feb. 1996, pp. 459-468, Livermore, California.

Nolte, S., et al., Ablation of Metals by Ultrashort Laser Pulses, J. Optical Society Am. B, vol. 14., No. 10, Oct. 1997, pp. 2716-2722, Hannover, Germany.

Haight, Richard, et al., Implementation and Performance of a Femtosecond Laser Mark Repair System in Manufacturing, Presentation of 1998 SPIE BACUS Meeting, pp. 1-8.

Ready, John F., LIA Handbook of Laser Materials Processing, Chapter 1: Overview of Laser Materials Processing, 2001, pp. 7-9.

Ready, John F., LIA Handbook of Laser Materials Processing, Ultrafast Lasers for Materials Processing, 2001, pp. 82.

Von Der Linde, D., et al., Breakdown Threshold and Plasma Formation in Femtosecond Laser-Solid Interaction, J. Opt. Soc. Am B/vol. 13, No. 1, Jan. 1996.

Zayhowski, Q-Switched Microchip Lasers Find Real World Application, Laser Focus World, Aug. 1999, pp. 129-136.

Corkum, P.B., et al., Thermal Response of Metals to Ultrashort-Pulse Laser Excitation, The American Physical Society, Dec. 19, 1988, vol. 61, No. 25, pp. 2886-2889.

Liu, Hsiao-Hua, et al., Effects of Wavelength and Doping Concentration on Silicon Damage Threshold, pp. 1-2.

Ready, John F., et al., Ultrashort-Pulse Laser Machining, LIA Handbook of Laser Materials Processing, Chapter 13, Hole Drilling, pp. 499-508.

Kyusho, Yukio, et al., High-Energy Subnanosecond Compact Laser System With Diode-Pumped, Q-Switched Nd: YVO, Laser, OSA TOPS on Advanced Solid-State Lasers, 1996, vol. 1, pp. 382-385.

Pronko, P.P. et al., Thermophysical effects in Laser Processing of Materials with Picosecond and Femtosecond Pulses, J. Appl. Phys. 78 (10) Nov. 15, 1995, pp. 6233-6240.

Ngoi, Bryan K.A., et al., Submicron Micromachining on Silicon Wafer Using Femtosecond Pulse Laser, 2001 Laser Institute of America, vol. 1, No. 1, pp. 41-43.

Washio, K., Laser Applications in Electronics and Optoelectronics Industry in Japan, Part of the SPIE Conference on Laser Applns. in Microelectronic and Optoelectronic Manufacturing IV, San Jose, CA, Jan. 1999, SPIE vol. 3618, pp. 230-239.

Washio, K., Laser Processing: Principles and Advanced Applications—Part 2, International Symposium on Microelectronics and Assembly, (ISMA '97 Educational Short Courses), pp. 1-101.

Zhu, Ziaonong, On Ultrashort Laser Pulse Machining, Optoelectronics World, Jun. 2001, pp. 1-16.

Optoelectronics World, Supplement to Laser Focus World, Micromachining: the growth engine for industrial lasers, Jun. 2001, (composed of 6 separate articles), Industrial Laser Solutions.

Jandeleit, J., et al., Picosecond Laser Ablation of Thin Cooper Film, Applied Physics A, A63, pp. 117-121, 1996.

Zhu, X., et al., Influence of Laser Parameters And Material Properties On Micro Drilling With Feemtosecond Laser Pulses, Applied Physics A, A69, pp. 367-S371, 1999.

North, J.C., Laser Vaporization of Metal Films-Effect of Optical Interference In Underlying Dielectric Layers, Journal of Applied Physics, vol. 48, No. 6, Jun. 1977.

Sun, Yunlong, Interference Effect On Laser Trimming And Layer Thickness Optimization, SPIE, vol. 1598, 1991.

Elliott, David, Ultraviolet Laser Technology And Applications, Wayland, MA, 1995, pp. 137-141.

Bechtel, James H., et al., Laser Applications, vol. 5, pp. 1-18 & 64-67.

Xenon Laser Repairs Liquid Crystal Displays, Waters, Laser and Optronics, 1988, vol. 7, No. 4.

Brisbane, A.D., et al., Electric Compon, 1968, pp. 147.

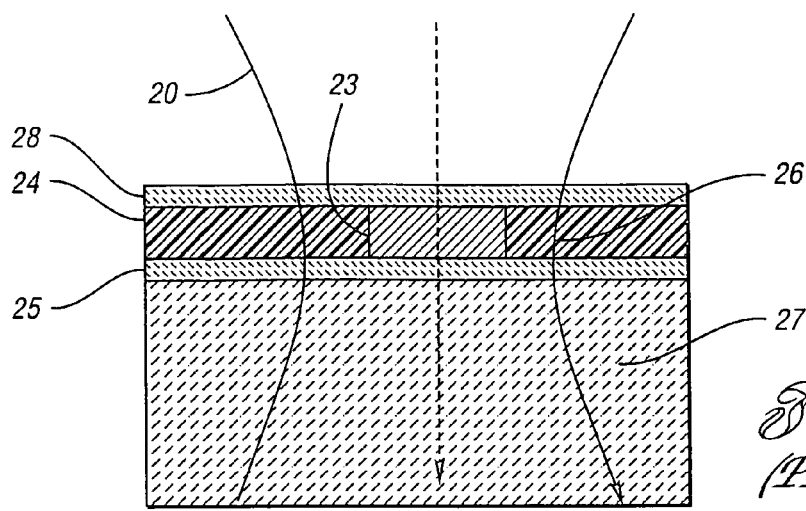
*Fig. 2b (PRIOR ART)*
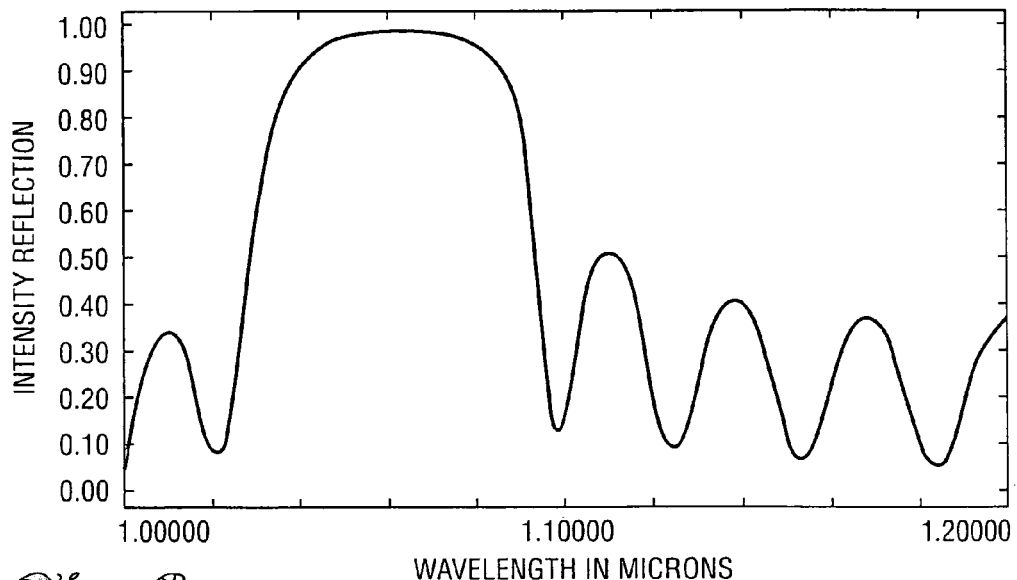
*Fig. 3*
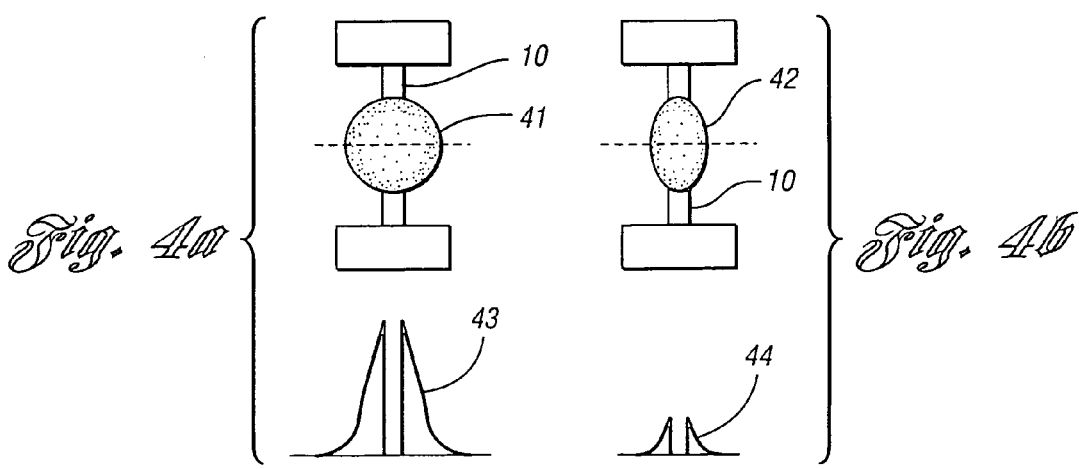
*Fig. 4a*  *Fig. 4b*

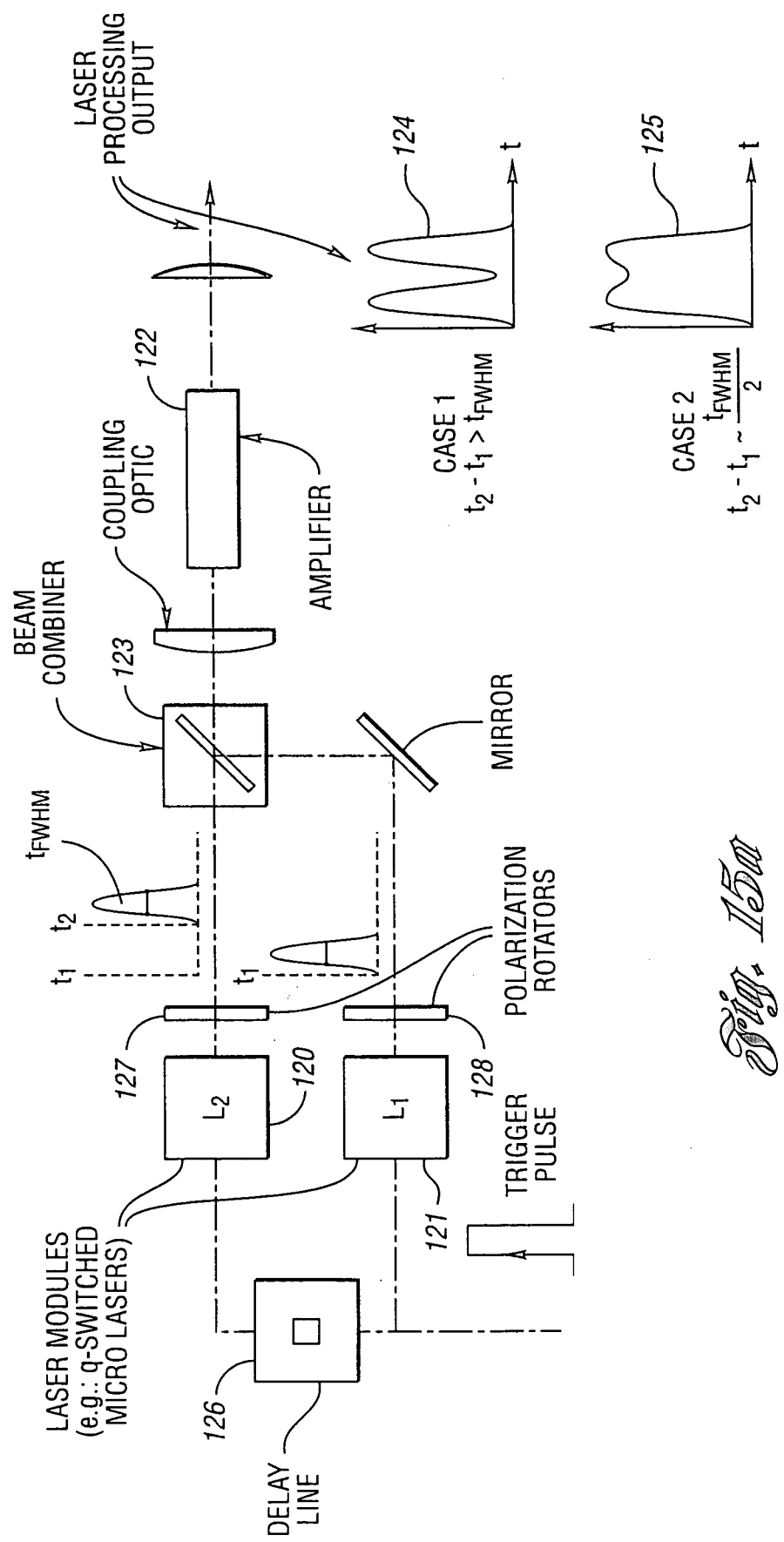

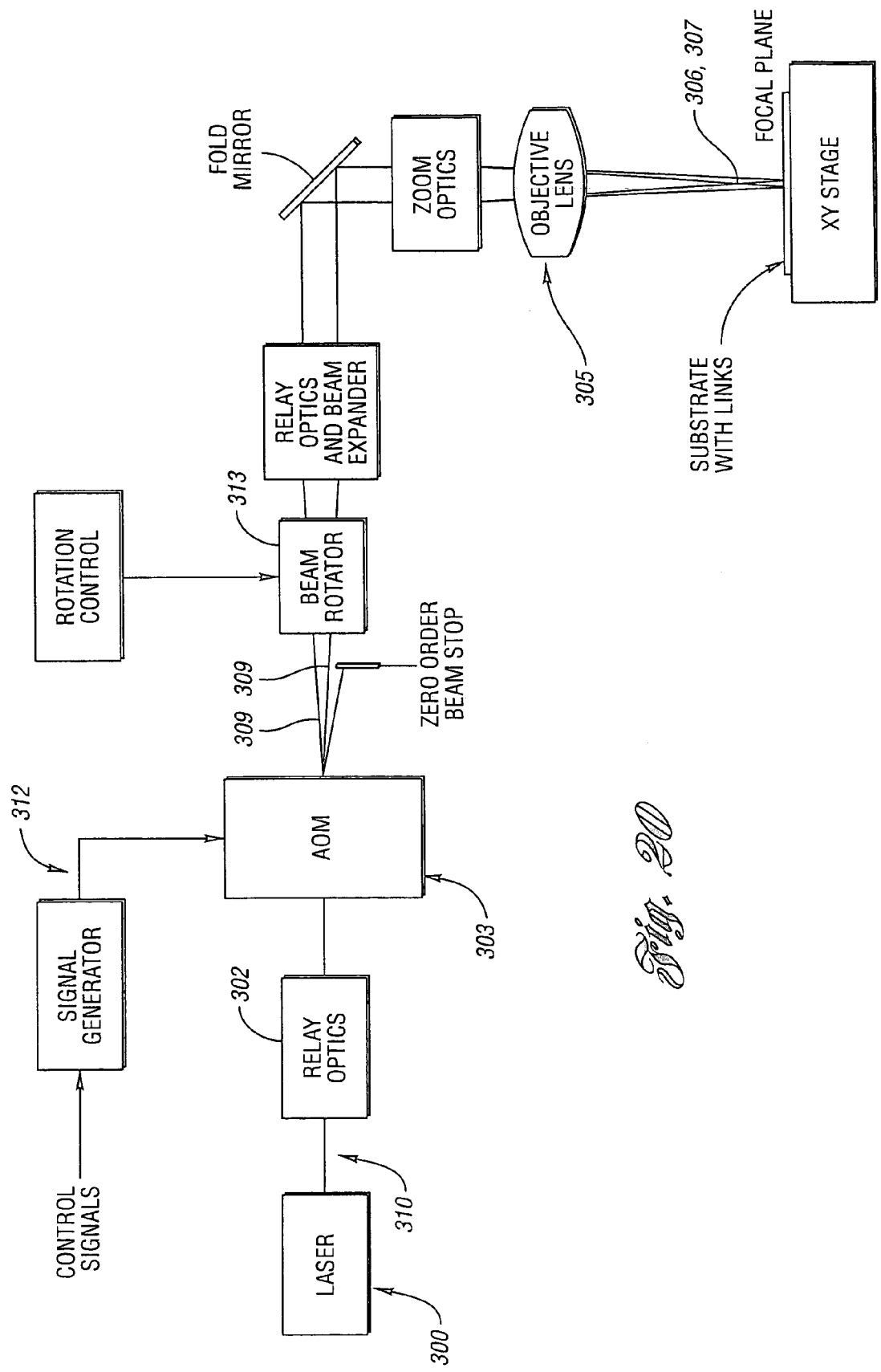

METHODS AND SYSTEMS FOR THERMAL-BASED LASER PROCESSING A MULTI-MATERIAL DEVICE

CROSS-REFERENCE TO RELATED APPLICATIONS AND PATENT

This application is a continuation of Ser. No. 10/107,890 filed on Mar. 27, 2002 entitled Methods And Systems For Thermal-Based Laser Processing A Multi-Material Device which claims the benefit of U.S. provisional application Ser. No. 60/279,644, filed Mar. 29, 2001, entitled "Method and System for Severing Highly Conductive Micro-Structures." This application is related to U.S. Pat. No. 6,639,177.

BACKGROUND OF THE INVENTION

1. Field of the Invention

The present invention relates to the field of laser processing methods and systems, and specifically, to laser processing methods and systems for thermal-based laser processing multi-material devices.

2. Background Art

In the repair of memory integrated circuits such as DRAMs and laser programming of high-density logic devices, the use of new materials, such as aluminum, gold, and copper, coupled with the small geometry of these devices, make the problem of link removal difficult. The new materials are typically metals or highly conductive composites having reflectivity that is well over 90% in the visible and near infrared wavelength regions. Aluminum, for example, reflects greater than 90% of the laser energy over the range from the UV through to the near infrared. Gold and copper reflects even more strongly in the near infrared, the wavelengths of choice used by most of the lasers repairing memories in production.

Further, economics and device performance have driven the size for the DRAMs and logic devices to very small physical dimensions. Not only are the devices small, but the interconnects and links thickness have also decreased dramatically in recent years.

Thermal laser processing of links relies on the differential thermal expansion between the oxide above the link and the link itself. This differential expansion results in a high pressure build-up of the molten link contained by the oxide. The oxide over the link is necessary to contain the link in a molten state long enough to build-up sufficient pressure to crack the oxide and explosively expel the link material. If the pressure is too low, the link will not be removed cleanly. Alternative laser wavelengths and laser control strive to increase the laser "energy window" without damaging the substrate and material contiguous to the link.

Descriptions of an all-copper, dual-Damascene process technology can be found in "Benefits of Copper—Copper Technology is Here Today in Working Devices," NOVELLUS DAMASEUS, Dec. 20, 2001; and "Preventing Cross-Contamination Caused By Copper Diffusion and Other Sources," P. Cacouvis, MICRO, July 1999.

FIGS. 2a and 2b illustrate prior art laser processing of multi-layer structure wherein a target structure is located in proximity to a substrate, with a q-switched pulse 20 from a conventional solid state laser 21 irradiating and overfilling a target structure 23. A laser spot size is typically significantly larger than the (target) link size which relaxes precision positioning requirements. A laser wavelength is typically selected based on substrate 27 (commonly Silicon) transmission so as to allow for higher peak laser power or other system and process variations. In certain cases, a layer 28,25 absorption coefficient is controlled (e.g., as a transition or protective layer) and/or a wavelength selected wherein substrate damage is avoided.

Further information is available regarding link blowing methods and systems, including material processing, system design, and device design considerations, in the following representative U.S. patents and published U.S. applications: U.S. Pat. Nos. 4,399,345; 4,532,402; 4,826,785; 4,935,801; 5,059,764; 5,208,437; 5,265,114; 5,473,624; 6,057,180; 6,172,325; 6,191,486; 6,239,406; 2002-0003130; and 2002-0005396.

Other representative publications providing background on link processing of memory circuits or similar laser processing applications include: "Laser Adjustment of Linear Monolithic Circuits," Litwin and Smart, ICAELO, (1983); "Computer Simulation of Target Link Explosion In Laser Programmable Memory," Scarfone, Chlipala (1986); "Precision Laser Micromachining," Boogard, SPIE Vol. 611 (1986); "Laser Processing for Application Specific Integrated Circuits (asics)," SPIE Vol. 774, Smart (1987); "Xenon Laser Repairs Liquid Crystal Displays," Waters, Laser and Optronics, (1988); "Laser Beam Processing and Wafer Scale Integration," Cohen (1988); "Optimization of Memory Redundancy Link Processing," Sun, Harris, Swenson, Hutchens, Vol. SPIE 2636, (1995); "Analysis of Laser Metal Cut Energy Process Window," Bernstein, Lee, Yang, Dahmas, IEEE Trans. On Semicond. Manufact., Vol 13, No. 2. (2000).

Also, the following co-pending U.S. applications and issued patents are assigned to the assignee of the present invention and are hereby incorporated by reference in their entirety:

1. U.S. Pat. No. 5,300,756, entitled "Method and System for Severing Integrated-Circuit Connection Paths by a Phase Plate Adjusted Laser beam";
2. U.S. Pat. No. 6,144,118, entitled "High Speed Precision Positioning Apparatus";
3. U.S. Pat. No. 6,181,728, entitled "Controlling Laser Polarization";
4. U.S. Pat. No. 5,998,759, entitled "Laser Processing";
5. U.S. Pat. No. 6,281,471, entitled "Energy Efficient, Laser-Based Method and System for Processing Target Material";
6. U.S. Pat. No. 6,340,806, entitled "Energy-Efficient Method and System for Processing Target Material Using an Amplified, Wavelength-Shifted Pulse Train";
7. U.S. Ser. No. 09/572,925, entitled "Method and System For Precisely Positioning A Waist of A Material-Processing Laser Beam To Process Microstructures Within A Laser-Processing Site", filed 16 May 2000, and published as WO 0187534 A2, December, 2001;
8. U.S. Pat. No. 6,300,590, entitled "Laser Processing"; and
9. U.S. Pat. No. 6,339,604, entitled "Pulse Control in Laser Systems."

However, it is to be understood that this listing is not an admission that any of the above references are prior art under the Patent Statute.

The subject matter of the above referenced applications and patents is related to the present invention. References to the above patents and applications are cited by reference number in the following sections.

SUMMARY OF THE INVENTION

An object of the present invention is to provide improved methods and systems for thermal-based laser processing multi-material devices.

In carrying out the above object and other objects of the present invention, a method for thermal-based laser processing a multi-material device including a substrate and at least one microstructure is provided. The processing occurs with multiple pulses in a single pass operation controlled with a positioning subsystem of a thermal processing system. The positioning subsystem induces relative motion between the device and laser beam waists. The processing removes the at least one microstructure without damaging the substrate. The method includes generating a first pulse having a first predetermined characteristic, and irradiating the at least one microstructure with the first pulse wherein a first beam waist associated with the first pulse and the at least one microstructure substantially coincide. The step of irradiating at least initiating processing of the at least one microstructure. The method also includes generating a second pulse having a second predetermined characteristic. The second pulse is delayed a predetermined time relative to the first pulse. The method further includes irradiating the at least one microstructure with the second pulse wherein a second beam waist associated with the second pulse and the at least one microstructure substantially coincide. The step of irradiating the at least one microstructure with the second pulse further processing the at least one microstructure wherein the processing of the at least one microstructure with the first and second pulses occurs during relative motion of the at least one microstructure and the beam waists in a single pass whereby throughput of the thermal processing system is substantially improved.

The device may be a semiconductor memory including a silicon substrate and the at least one microstructure may be a metal link of the semiconductor memory separated from the silicon substrate by at least one oxide layer.

At least one of the pulses may have a duration of greater than a few picoseconds to several nanoseconds.

The pulses may be generated by a mode-locked laser system and amplified with an optical amplifier.

At least one of the pulses may be generated by a q-switched microlaser having a pulsewidth less than 5 nanoseconds.

The first and second pulses may be propagated along different optical paths so that the second pulse is delayed for the predetermined time relative to the first pulse based on a difference in optical path length.

The pulses may have a temporal spacing less than or approximately equal to the predetermined time. The method further include selecting the second pulse to irradiate the at least one microstructure.

The predetermined time may be determined by a thermal property of the substrate wherein substrate temperature is substantially reduced after the predetermined time compared to the temperature of the substrate during the step of irradiating the at least one microstructure with the second pulse.

The substrate temperature may be substantially reduced to approximately room temperature.

The first and second predetermined characteristics may include a substantially square temporal pulse shape having a rise time of less than about 2 nanoseconds and a pulse duration of about 10 nanoseconds.

The predetermined time may be in the range of about 20-50 nanoseconds, or may be in the range of about 30 nanoseconds.

Two pulses may be used to completely process the at least one microstructure, and laser energy of each of the pulses is about 60-70% of laser energy required for laser processing the at least one microstructure with a single pulse.

Relative position change between the pulses at the at least one microstructure may be less than about 10% of a dimension of the at least one microstructure to be processed.

At least one of the first and second predetermined characteristics may include a substantially square pulse.

At least one of the predetermined characteristics may include a non-circular spatial profile based on a selected numerical aperture and shape of a spot and the spot and the at least one microstructure are substantially correlated in at least one dimension whereby percent of laser energy delivered to the at least one microstructure is increased and irradiance of the substrate is decreased.

A spatial beam shape of the second pulse may be in the form of a cleaning beam having an energy density lower than energy density of the first pulse.

The cleaning beam may have an attenuated central region and a higher energy outer region so as to remove debris surrounding a target site on the at least one microstructure.

The steps of generating may include directing a portion of a laser pulse through an optical subsystem having opposing, spaced-apart, corner cube reflectors and polarization rotators so as to align a pulsed laser beam, and to control delay and amplitude of the second pulse relative to the first pulse.

The steps of generating may further include providing an optical subsystem having multiple lasers wherein delay between trigger pulses to the optical subsystem determines the predetermined time.

A fiber optic delay line may delay the second pulse for the predetermined time and the predetermined time may be about several nanoseconds.

Relative position change between the pulses at the at least one microstructure may be either greater than about 10% of a dimension of the at least one microstructure to be processed or greater than about ½ of either of the beam waists and may further include a high speed beam deflector operatively coupled to the positioning subsystem to compensate for relative motion between the pulses. The second pulse may be deflected by the deflector to also substantially irradiate the at least one microstructure with the second pulse.

The predetermined time may be in the range of about 10 ns to 10 µs.

The beam deflector may be a single axis acousto-optic device.

The first and second predetermined characteristics may be based on physical properties of the multi-material device.

The first pulse may irradiate a first portion of the at least one microstructure and the second pulse may irradiate a second portion of the at least one microstructure, and relative position change between the first and second portions of the at least one microstructure may be less than ¼ of either of the beam waists.

The step of providing may also provide at least one optical amplifier optically coupled to at least one of the lasers.

The at least one microstructure and the beam waists may be relatively positioned during relative motion based upon three-dimensional information.

The steps of generating may include generating a single pulse and forming the first and second pulses from the single pulse.

The step of forming may delay the second pulse for the predetermined time relative to the first pulse.

The step of forming may include splitting the single pulse with a multi-frequency deflector to form the first and second pulses.

First and second microstructures may be irradiated by the first and second pulses, respectively.

Further in carrying out the above object and other objects of the present invention, a system for thermal-based laser processing a multi-material device including a substrate and at least one microstructure is provided. The processing occurs with multiple pulses in a single pass operation controlled with a positioning subsystem which induces relative motion between the device and laser beam waists. The processing removes the at least one microstructure without damaging the substrate. The system includes means for generating a first pulse having a first predetermined characteristic, and means for irradiating the at least one microstructure with the first pulse wherein a first beam waist associated with the first pulse and the at least one microstructure substantially coincide. The first pulse at least initiating processing of the at least one microstructure. The system also includes means for generating a second pulse having a second predetermined characteristic. The second pulse is delayed a predetermined time relative to the first pulse. The system further includes means for irradiating the at least one microstructure with the second pulse wherein a second beam waist associated with the second pulse and the at least one microstructure substantially coincide. The second pulse further processing the at least one microstructure wherein the processing of the at least one microstructure with the first and second pulses occurs during relative motion of the at least one microstructure and the beam waists in a single pass whereby throughput of the system is substantially improved.

The means for generating may include a mode-locked laser system and may further include an optical amplifier for amplifying the pulses.

At least one of the means for generating may include a q-switched microlaser having a pulsewidth less than 5 nanoseconds.

The pulses may have a temporal spacing less than or approximately equal to the predetermined time. The system may further include means for selecting the second pulse to irradiate the at least one microstructure.

The predetermined time may be determined by a thermal property of the substrate wherein substrate temperature may be substantially reduced after the predetermined time compared to the temperature of the substrate during irradiation of the at least one microstructure with the second pulse.

The means for generating the first and second pulses may include an optical subsystem having opposing, spaced-apart, corner cube reflectors and polarization rotators so as to align a pulsed laser beam, and to control delay and amplitude of the second pulse relative to the first pulse.

The means for generating the first and second pulses may also include an optical subsystem having multiple lasers wherein delay between trigger pulses to the optical subsystem determines the predetermined time.

The means for generating the first and second pulses may further include means for generating a single pulse and means for forming the first and second pulses from the single pulse.

The means for forming may include a multi-frequency deflector for splitting the single pulse to form the first and second pulses.

Still further in carrying out the above object and other objects of the present invention, a method for thermal-based laser processing a multi-material device including a substrate and a microstructure is provided. The method includes generating the at least one laser pulse having at least one predetermined characteristic based on a differential thermal property of materials of the device. The method also includes irradiating the microstructure with the at least one laser pulse wherein a first portion of the at least one pulse increases a difference in temperature between the substrate and the microstructure, and a second portion of the at least one pulse further increases the difference in temperature between the substrate and the microstructure to process the multi-material device without damaging the substrate.

The first and second portions may be portions of a single pulse, or may be portions of different pulses.

The first portion of the at least one pulse may increase temperature of the microstructure.

The first portion may be a high density leading edge portion of the at least one pulse.

The leading edge portion may have a rise time of less than two nanoseconds.

The rise time may be less than one nanosecond.

The first and second portions of the at least one pulse may be sufficient to remove the microstructure.

The microstructure may be a metal link having reflectivity, and the leading edge portion of the at least one pulse may reduce the reflectivity of the metal link.

The substrate may be silicon and the device may be a semiconductor memory.

The second portion of the at least one pulse may further increase the temperature of the microstructure.

The step of irradiating may be completed in a period between 5 and 75 nanoseconds.

The period may be between 10 and 50 nanoseconds.

Yet still further in carrying out the above object and other objects of the present invention, a system for thermal-based laser processing a multi-material device including a substrate and a microstructure is provided. The system includes means for generating the at least one laser pulse having at least one predetermined characteristic based on a differential thermal property of materials of the device. The system also includes means for irradiating the microstructure with the at least one laser pulse wherein a first portion of the at least one pulse increases a difference in temperature between the substrate and the microstructure, and a second portion of the at least one pulse further increases the difference in temperature between the substrate and the microstructure to process the multi-material device without damaging the substrate.

The above object and other objects, features, and advantages of the present invention are readily apparent from the following detailed description of the best mode for carrying out the invention when taken in connection with the accompanying drawings.

BRIEF DESCRIPTION OF THE DRAWINGS

FIG. 1b is a first side sectional view of a portion of the device, showing a target structure having a rectangular cross-section, wherein a high numerical aperture laser beam, having a non-unity aspect ratio, is incident on the target structure having a plurality of layers forming a stack; FIG. 1c is a second side sectional view of a portion of the device, orthogonal to the first, showing a rectangular target structure, wherein a high numerical aperture laser beam, having a non-unity aspect ratio, is incident on the target structure;

FIG. 2b is a view of a conventional multi-layer structure having a single oxide layer between the link and substrate, therefore being located in proximity to a substrate, with a conventional q-switched laser pulse irradiating and substantially overfilling the narrow dimension of the target structure;

FIG. 3 is a graph of reflection as a function of wavelength of a multi-layer stack having 28 layers in 14 pairs, the stack representative of a device processed with a method and system of the present invention;

FIGS. 4a and 4b are top views and associated graphs which illustrate the effect of irradiating the target structure with laser beam profiles of varying dimension with respect to the target structure; FIGS. 4a and 4b show the result of truncating a representative non-uniform Gaussian shaped laser spatial profile, wherein the energy enclosed by the target structure is strongly affected, the energy at the target edge varies, and potential stray radiation effects result from energy not absorbed by the target structure;

FIG. 5a illustrates the increase in spot area with for various spherical and elliptical Gaussian irradiance distributions, for a representative multi-layer stack used in a copper memory process;

FIG. 5b normalizes the defocus function relative to the energy density (fluence) at the target location;

FIGS. 15a-15c show various arrangements for combining laser pulses or generating a sequence of closely spaced pulses using optical or electronic delay methods; FIG. 15a illustrates use of multiple lasers with delayed triggering; FIG. 15b illustrates a basic arrangement with a single laser and an optical delay path; and FIG. 15c illustrates yet another modular optical delay line providing for pointing stability and simplified alignment;

FIG. 20 is a block diagram of another system of the present invention wherein a beam deflector is used to spatially split a single pulse so as to irradiate either one or two microstructures (or none) with a pair of pulses during relative motion.

DETAILED DESCRIPTION OF THE PREFERRED EMBODIMENTS

Figure 1A:
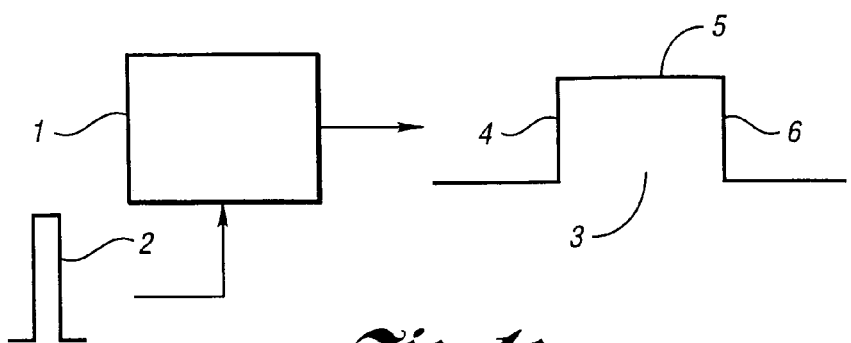
FIG. 1a is a block diagram of a laser system which generates a laser pulse in response to a trigger signal obtained from a control system, the pulse having a temporal shape including a fast rise and fall time, and a duration selected for the material processing application of the present invention.

One aspect of the invention is removal of a microscopic target structure which is part of a multilayer, multimaterial device, wherein laser energy is incident on several materials having dissimilar optical and thermal properties. One application is memory repair. A new fabrication process (Damascene) includes a copper target structure, multiple dielectric layers in the form of a "stack," and functional circuitry disposed at the dielectric layers. The target structure and layers are typically formed on a silicon substrate. This is illustrated in FIGS. 1b and 1c and corresponds to a device processed with an embodiment of the present invention. This will be referred to as a "multilevel" process.

With the use of more complex structures at finer scale (e.g., at or below a wavelength of visible light), considerations for reliable operation of laser processing system increase to meet the standards for high yield in the semiconductor industry.

Aspects of the invention include methods and subsystems for operation of the laser processing system. At the microscopic scale, the laser beam waist diverges rapidly due to the small spot size and depth of focus. The materials within the 3D beam location may include functional circuitry. In an automatic system, robust measurement of target locations is used in conjunction with database information to position a laser beam in three dimensions at high speed. The interaction of a laser beam within the multilevel device influences yield. Modeling of thermal interaction is useful of understanding and predicting performance in the thermal processing regime. However, at the microscopic scale, a more detailed understanding of interaction based on physical optics is also beneficial.

In the following sections, detailed aspects of spatial and temporal pulse shaping, three-dimensional measurement and prediction, device modeling and process design are disclosed with emphasis on solving the problem of cleanly removing links on a multilevel device, wherein damage is avoided to inner layers and functional circuitry between a link and the substrate. However, various methods, subsystems, and experimental results may also be applied for link processing of conventional single inner layer devices, and generally for processing microstructures surrounded by materials having dissimilar thermal or optical properties.

Processing Links on a Multilevel Device

A pulsed laser beam, the beam having pre-determined characteristics for processing of microscopic structures, is used to cleanly remove at least a portion of a target structure. An application of the method and system of the present invention is severing of highly reflective copper links which are part of a high speed semiconductor memory device. The method and system of the present invention is particularly advantageous for processing of targets having a sub-micron dimension, including targets with a dimension below the wavelength of the laser beam. The target is separated from a semiconductor substrate by a multi-layer stack, which may have several dielectric layers. Furthermore, both the temporal and spatial characteristics of the pulse may be selected or controlled based on the thermal and optical properties of the microscopic target, underlying layer materials, and the three-dimensional layout of the device structure, including the spacing of target structures and functional inner conductor layers.

Figure 1B:
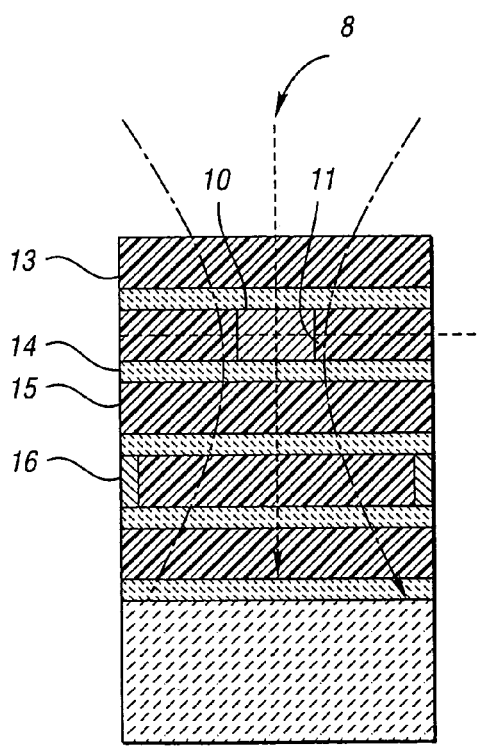
FIGS. 1b and 1c are views partially broken away illustrating a multi-layer, multi-material device wherein a laser pulse with pre-determined temporal and spatial characteristics irradiates the device.
Figure 1C:
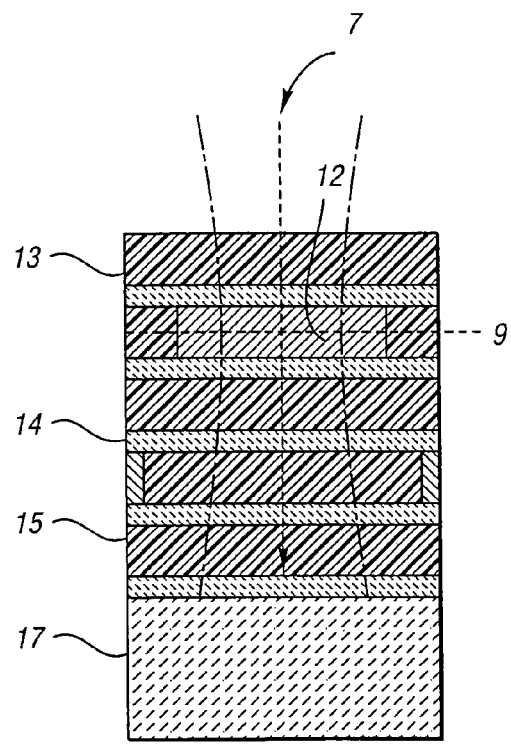

FIGS. 1a-1c generally show an embodiment of the present invention A laser pulse 3 irradiates a rectangular target structure or microstructure 10, side views of which are shown in FIGS. 1b and 1c, with a focused beam. In a preferred embodiment, an output from short pulse amplified laser system 1 is generated to produce the pulse 3 which has a rise time 4 fast enough to efficiently couple energy into a highly reflective target structure. The duration 5 is sufficient to process the target structure wherein at least a portion of the structure is cleanly removed without leaving residue, slag, or other debris. The fall time 6 is preferably fast enough to avoid creating undesirable damage to the layers or substrate.

The temporal pulse shape is selected, in part, based on physical properties of the target microstructure 10, for instance, thickness, optical absorption, thermal conductivity, or a combination thereof. In an advantageous embodiment of the invention, the processing will occur with a single pulse having a fast edge leading relative to a selected pulse duration of several nanoseconds. In an alternative embodiment, the laser output may be a series of narrow q-switched or rectangular pulses, with very fast rise time, for example 800 ps pulses representative of the output of commercially available q-switch micro-lasers. The pulses may be delayed with respect to each other so as to provide a burst of pulses to irradiate the target structure. The laser output may be generated with a combination of a high bandwidth seed laser diode and fiber optic amplifier with Raman shifting, or with a waveguide amplifier system. Alternatively, a desirable pulse characteristic may be provided with various modified q-switched systems or with the use of high speed electro-optic modulators. Other pulse shapes may be selected for the material processing requirements. For instance, a sequence of closely spaced pulses having duration from a few picoseconds to several nanoseconds is taught in Reference 5.

In one embodiment, a high bandwidth MOPA configuration is used to amplify the laser output of a high speed semiconductor diode. Generation of various pulse shapes and duration with direct modulation of the diode is considered advantageous, provided any affect associated with variable amplitude drive waveforms does not affect overall performance. Further details of various aspects of pulse generation and amplification can be found in references 5 and 6 (e.g., in '471—Reference 5—FIG. 5 and columns 14-16).

As indicated above, embodiments of the laser system may include fiber optic amplifiers which amplify the preferred square pulse shape generated by a seed laser. The seed laser may be a high speed semiconductor diode or the shaped output of a modified q-switched system. The amplified output may be matched in wavelength to the input or Raman-shifted as taught in References 4 and 6 (e.g., in Reference 6, FIGS. 12-13 and column 14, line 57—column 19, line 3). Wavelength shifting of a short pulse q-switched laser output is generally taught in '759 Reference 4.

In an alternative arrangement the seed laser is a semiconductor diode and the optical amplifier is a waveguide amplifier. Advantages of an embodiment with a waveguide amplifier when compared to a fiber system include avoidance of Raman shifting, lower pulse distortion at the speed of operation, and, with proper design, minimal thermal lensing. A precision anamorphic optic system is used to optimize coupling between the seed and amplifier. Basic description of waveguide amplitude and lasers can be found in product literature provided by Maxios, Inc. and in the article "CW and passively Q-switched Cladding Pumped Planar Waveguide Lasers," Beach et. al. Yet another amplifier system including a 28 DB planar waveguide amplifier for use at 1.064 μm wavelengths was developed by University of Southhampton and described in "A Diode Pumped, High Gain, Planar-Waveguide, Nd:Y3A15012 Amplifier."

In an alternative arrangement, for generation of a fast rising pulse or other desirable shape, a plurality of q-switched micro-lasers can be used. The modules produce a q-switched waveform with pulse durations of about 1 nanosecond or less, for example 800 ps to 2 ns for commercially available units. An example of a commercially available laser is the AOT-YVO-LQ available from Advanced Optical Technology (AOTLasers.com). These recently developed short pulse, active q-switch lasers can be triggered with a TTL pulse at a variable repetition rate while maintaining specified sub-nanosecond timing jitter. In general, the pulse shape incident on the target microstructure will vary significantly at repetition rates approaching the maximum rate. Reference 9 teaches methods of maintaining a constant pulse shape despite variations in the temporal spacing of pulses incident on a target (e.g., see the figures and associated specification). AOT offers a pulsewidth of 2 nanoseconds available at a repetition rate of 20 KHz. Frequency doubled versions are also available (532 nm). IMRA America reports 800 ps pulses with the PicoLite system, and high peak power was obtained with fiber amplification at repetition rates up to 10 KHz. Shorter pulsewidths, for instance about 1 ns or less, are available at slower repetition rates.

Figure 2A:
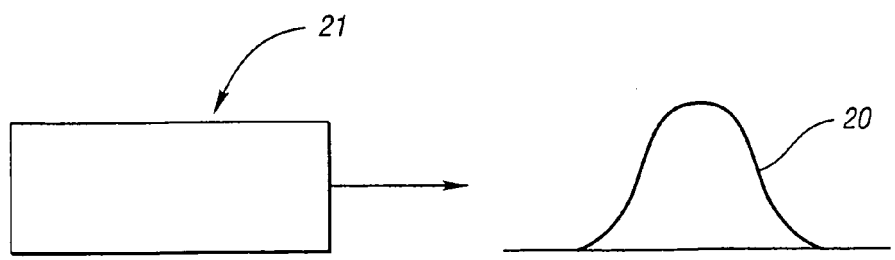
FIG. 2a is a block diagram of a prior art laser system which shows a conventional q-switched or Gaussian pulse.
Figure 15B:
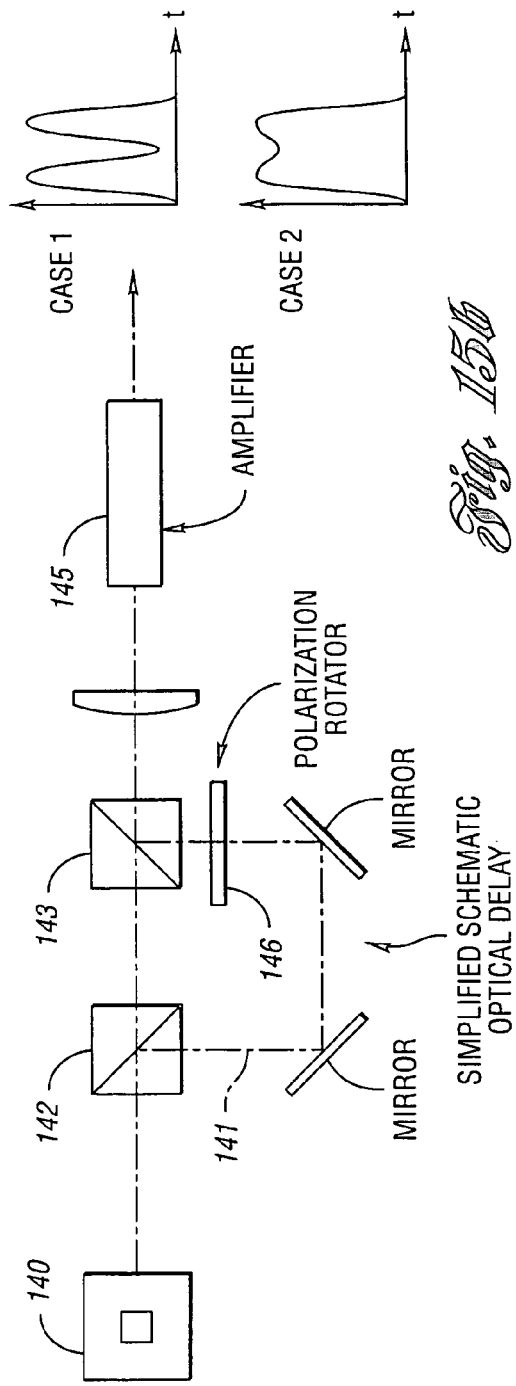
Figure 15C:
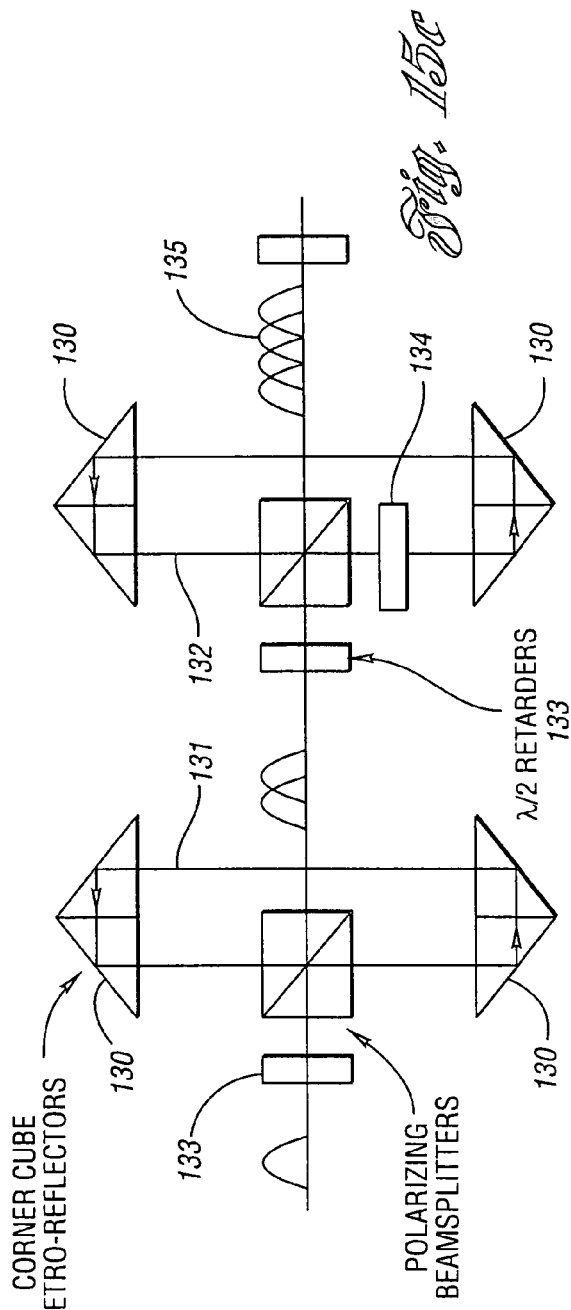

As known in the art and illustrated in Reference 5 (e.g., FIGS. 1c, 2), the q-switched waveforms may approximate (at least to 1st order) a symmetric Gaussian shape, or a fast rising pulse with an exponential tail, depending on the stored energy. With reference to FIGS. 15a-15c, a series of devices, with appropriate delays introduced by a plurality of triggering signals, or delays of a trigger signal with a delay line, is used to generate a series of spaced apart pulses. The optical outputs are preferably combined with appropriate bulk optics (polarization sensitive), fiber optics, or waveguides to form a single output beam. The resultant addition of the q-switched waveforms produces a fast rise time characteristic and relatively short duration. An optical amplifier 122 may be used to increase the output power as needed.

FIG. 15a shows a schematic of one basic embodiment with bulk optics, where a beam combiner 123 is used to deliver the output of two lasers 120,121 to an amplifier 122. A delay circuit 126, which may be programmable, controls triggering. Polarization optics 127,128 are used to provide the proper input to the beam combiner. In one arrangement the pulses are spaced apart and appear as a high frequency burst 124. In a second arrangement triggering of the second pulse occurs at a slightly delayed (but controlled) position which produces a characteristic approximating a square pulse shape 125. In the latter arrangement the controlled delay is about 50% of the FWHM. Those skilled in the art will recognize that alternative arrangements may be used with multiple amplifiers, combiners, with bulk, fiber, or integrated optic arrangements.

Generation of multiple pulse waveforms may also include some form of active q-switching of two separate microlasers or detecting a first pulse from a passively q-switched laser and subsequently triggering an actively q-switched laser or MOPA relative to the first pulse.

FIG. 15-b is a basic schematic showing the use of a single laser 140 wherein the laser output is divided by beam splitter 142, whereby a portion of the beam propagates along a path 141, followed by combining with combiner 143, after polarization adjustment with rotator 146 which may be a half-wave plate. An optional optical amplifier 145 may then be used to produce higher output power.

In an arrangement using a single laser and an optical delay line, the optical system will preferably be stable and easy to align. FIG. 15c shows an exemplary embodiment wherein the use of opposing corner cube retroreflectors 130 makes the setup insensitive to tilt of the folding elements. The angular alignment of the delayed beam paths 131, 132 is very stable even in a high vibration environment. One of the corner cubes in each pair of retroreflectors 130 is initially adjusted in the X/Y translation and Z rotation to get the transverse position of the delayed beam path centered. Each of the $\lambda/2$ retarders 133 in the main beam path is adjusted so that vertical or horizontally polarized light will have its polarization rotated by 45 degrees. The $\lambda/2$ retarder 133 in the second delay loop is adjusted so that vertical or horizontal polarized light will have the polarization rotated by 90 degrees causing the delayed pulse in the second loop to circulate twice before exiting. The peak-to-peak spacing of the output waveform 135 (e.g., 4 combined pulses) is controlled by the length of the delay loops. If non-equal amplitudes for the delayed pulses are desired, the $\lambda/2$ retarders 133 in the main beam can be set for a polarization of other than 45 degrees. Likewise, the pulse shape can be varied at the time a system is setup or possibly in operation by manually or automatically controlling the spacing. Those skilled in the art of laser pulse generation and shaping will appreciate the advantages of the compact and modular arrangement for short pulse for typical delays ranging from a few nanoseconds to tens of nanoseconds. For instance, U.S. Pat. No. 5,293,389 to Hitachi describes a polarization-based fiber delay line for generating laser pulses of decreasing amplitude for generating longer pulses, for instance 100 ns or longer.

Another means of producing a shaped pulse is to use the modulator approach to chop the leading edge or tail of the pulse but with a two-stage or shaped modulation voltage pulse. For example: with a 10 ns q-switched pulse, the modulator could have 100% transmission for the first 1-5 ns followed by 25% transmission for the remainder of the pulse. Early pioneering work by Koechner (U.S. Pat. No. 3,747,019) and Smart (U.S. Pat. No. 4,483,005) demonstrate exemplary amplitude and pulse shape control methods using electro-optic modulators.

The multiple pulses shown in FIGS. 15a-15c may or may not have the same wavelength, and the temporal shape of a pulse may be varied depending upon specific requirements. For example, in certain embodiments an output may be a q-switched pulse of short duration and high peak power combined with a lower power square pulse shape.

Referring to FIGS. 1a and 1b, during system operation for memory repair, position information, obtained with a precision measurement system, is used to relatively position the focused beam waist of the pulsed laser at a location in space 7,8,9 to substantially coincide with the target 10 three-dimensional coordinates (Xlink, Ylink,Zlink). A trigger pulse 2, generated at a time where the laser beam waist and target position substantially coincide, operates in conjunction with the laser and associated control circuitry in laser subsystem 1 to produce an output pulse.

Figure 7A:
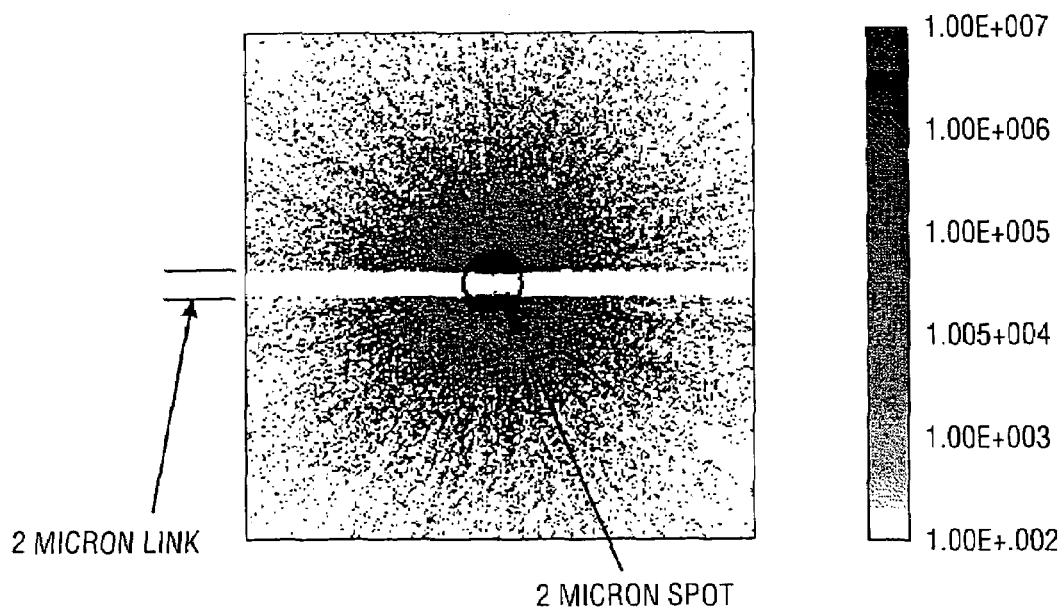
FIGS. 7a, 7b, 8 and 9 are views of images taken from detectors and which illustrate, on a continuous scale spanning 5 decades, simulated patterns of radiation at the surface, substrate, and with the stack removed respectively.
Figure 7B:
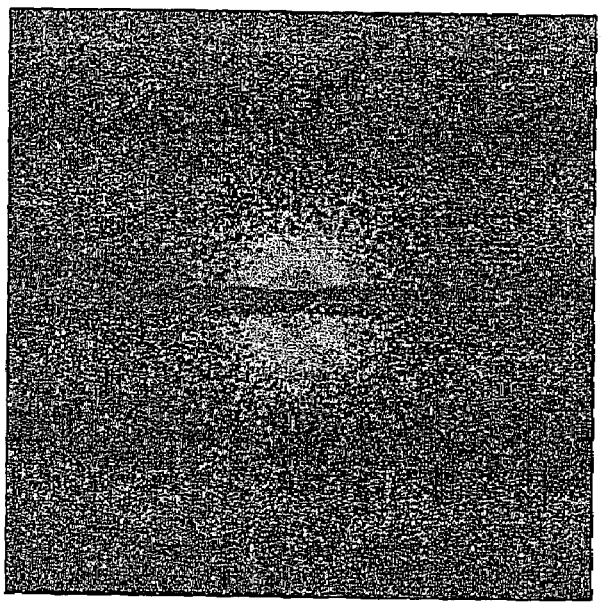
Figure 7B:
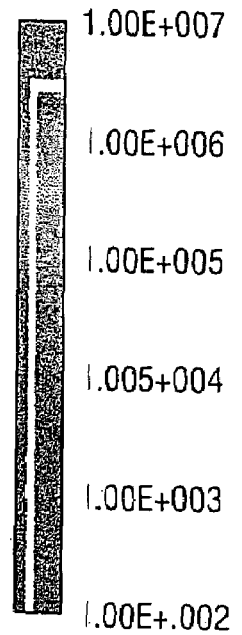
Figure 8:
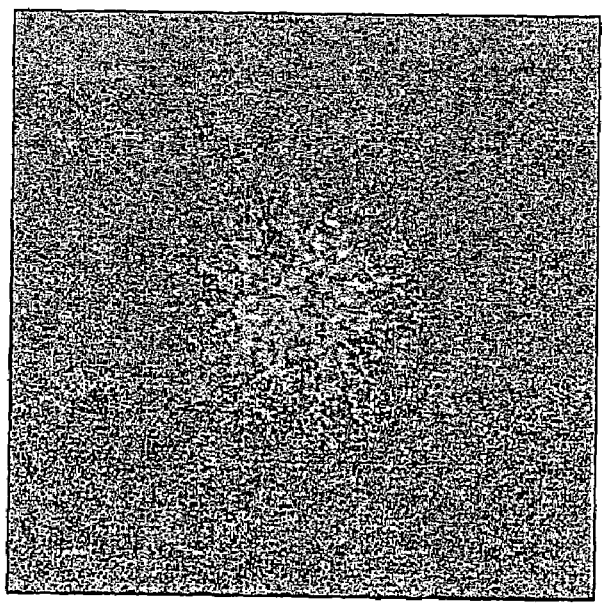
Figure 8:
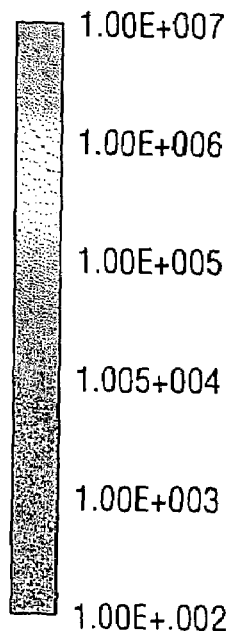

References 2 and 7 describe details of a method and system for precision positioning, including three-dimensional beam waist positioning. Reference 7 describes a preferred embodiment for producing an approximate diffraction limited spot size with a range of spot size adjustment (e.g., FIGS. 7-9 of WO0187534 ('534) and the associated specification), and a preferred method and system for three-dimensional positioning of the beam waist. Three-dimensional (height) information is obtained, for instance with focus detection, and used to estimate a surface and generate a trajectory (e.g., FIGS. 2-5 of '534 and the associated specification). The laser is pulsed at a location substantially corresponding to the three-dimensional position of the link (Xlink, Ylink, Zlink) (e.g., FIGS. 10a-b of '534 and the associated specification).

In practice, the three-dimensional measurement and positioning are used to compensate for topographical variations over a wafer surface, or other position variations introduced in a system (mis-alignment). These variations are generally system or application dependent and may exceed several microns, which in turn exceeds the depth of focus of the focused laser beam. In some micro-machining applications the system positioning requirements may be relaxed if certain tolerances are maintained, or if external hardware manipulates the device position, as might be done with a micro-positioning sub-system. The device may comprise a miniature part (e.g., single die) which is positioned by an external micro-positioning subsystem to a predetermined reference location. Similarly, if a miniature part has a pre-determined tolerance the positioning may be based on single measurement at a reference location or perhaps a single depth measurement combined with a lateral (X, Y) measurement. For processing of multilevel devices on wafers, (e.g.: 300 mm) at high speed it is expected that densely sampled three-dimensional information will improve performance, particularly as link dimensions shrink.

Figure 9:
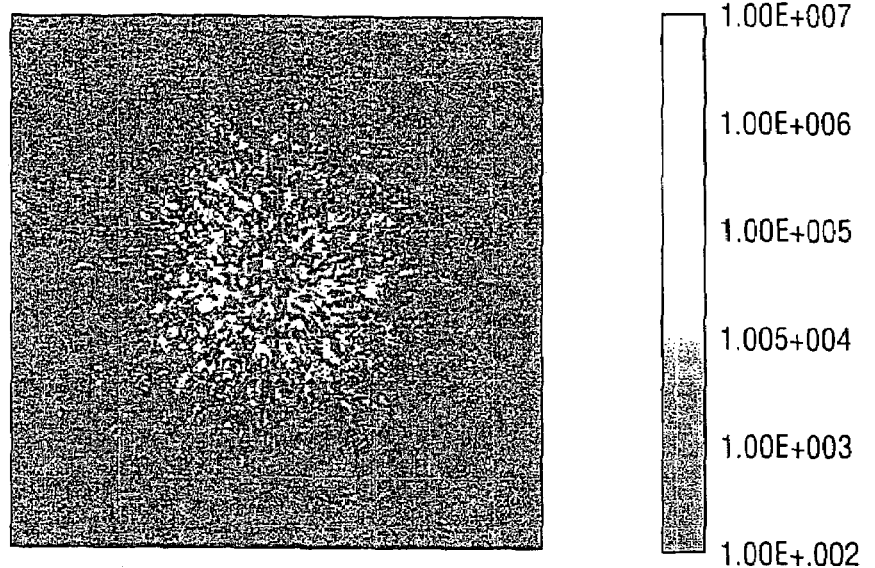
Figure 10:
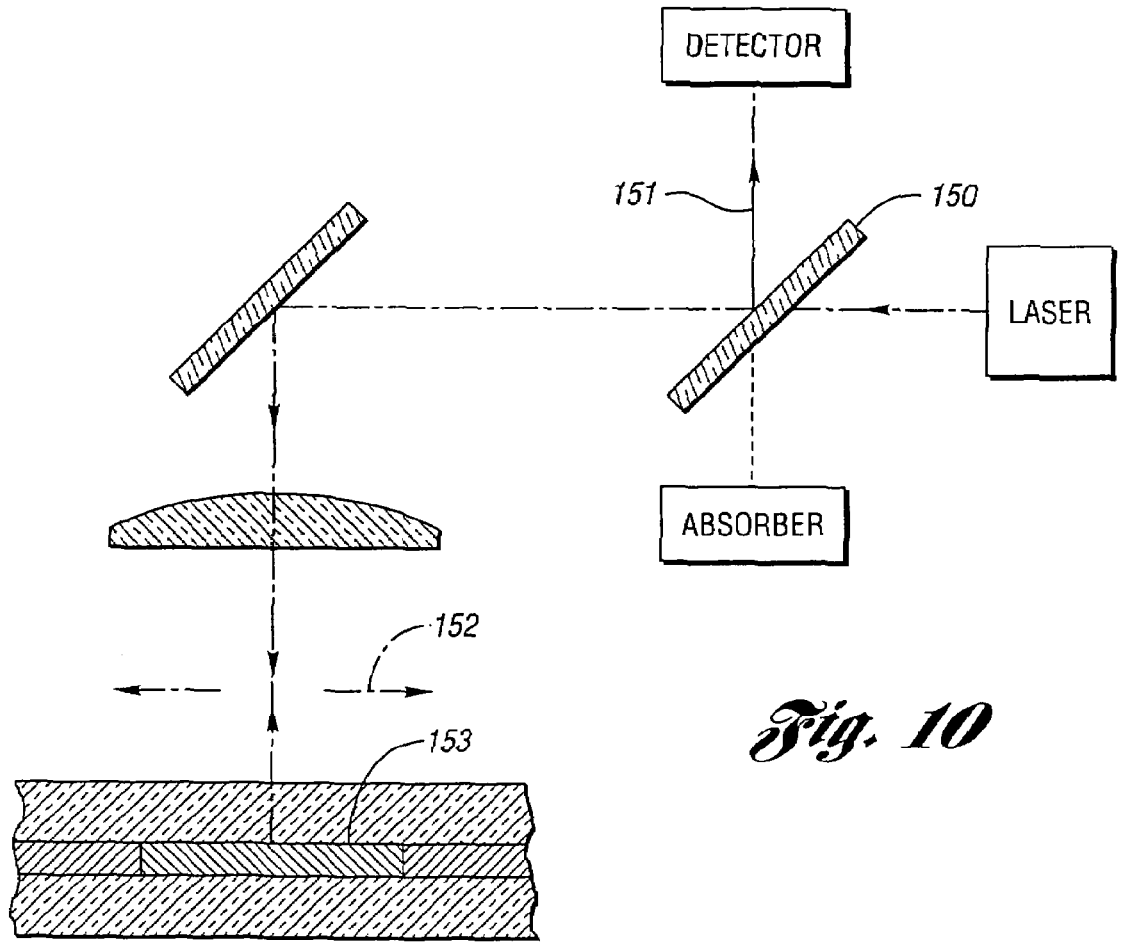
FIG. 10 is a schematic diagram of a system for measuring fiducials or other alignment targets.
Figure 11:
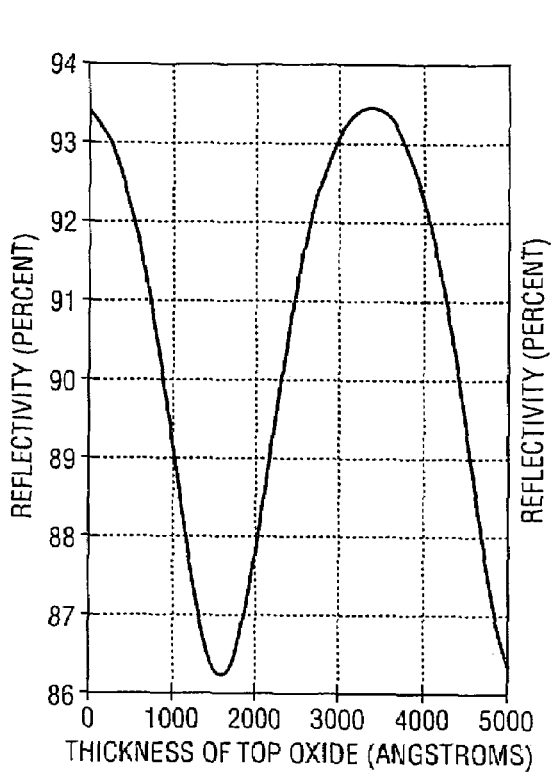
FIG. 11 is a graph of reflectivity versus outer layer thickness.

In applications requiring very high speed operation over a large surface (e.g., 300 mm wafer), an alternative method is to combine information which may be predetermined (e.g., the plane of a wafer chuck relative to a beam positioner plane of motion measured during a calibration process) with dimensional information obtained from each part to be processed. For example, in '534, FIGS. 1-2, a fraction of the tilt of region 28 may be associated with fixturing). For example, the steps may include (a) obtaining information identifying microstructures designated for removal, (b) measuring a first set of reference locations to obtain three-dimensional reference data, (c) generating a trajectory based on at least the three-dimensional reference data to obtain a prediction of beam waist and microstructure surface locations, (d) updating the prediction during relative motion based on updated position information, the updated position information obtained from a position sensor (e.g., encoder) and/or from data acquired during the relative motion. The additional data may be measurement data acquired at additional alignment target or at other locations suitable for an optical measurement (e.g., dynamic focus). Reference 2 describes a system wherein a precision wafer stage is used to position a wafer at high speed. A method of obtaining feedback information with resolution of a fraction of one nanometer is disclosed wherein interferometric encoders are used, and such a high precision method is preferred. In Reference 2 it was noted that other conventional laser interferometers may also be used. FIGS. 9-11 and columns 5-6 of Reference 2 describe aspects of the precision measurement subsystem associated with the precision positioning apparatus. Additionally, designated reference locations on the workpiece (e.g., wafer) which may be an x,y alignment target or a region suited for a three-dimensional measurement may be used for various applications. It should also be noted that height accuracy of about 0.1 μm was reported in "In-situ height correction for laser scanning of semiconductor wafers," Nikoonhad et al., Optical Engineering, Vol. 34, No. 10, October 1995, wherein an optical position sensor obtained area averaged height data at high speeds. Similarly, a dynamic focus sensor (e.g., astigmatic systems used for optical disk tracking and control) may be used to obtain height information provided the data rate is fast enough to support "on the fly" measurement.

Various combinations of the above technologies can be used depending upon the application requirements. A combination may be based on the number and typical distribution over a device of microstructures designated for removal. When a large number of repair sites are distributed across a device, the throughput may be maximized by providing updates "on the fly."

In an application of the invention, the target structure 10 is provided as a part of a multi-material, multi-layer structure (e.g., redundant memory device). The multi-layer stack having dielectric layers 14, 15 provides spacing between the link and an underlying substrate 17. In one type of multi-layer memory device, alternating layers of Silicon Dioxide 15 and Silicon Nitride 14 may be disposed between a copper link target structure 10 and a Silicon substrate 17. The copper target structure is generally located in proximity to other similar structures to form a 1-D or 2-D array of fuses which are designated for removal. In addition to the copper link structure, underlying conductors 16 disposed as part of the functional device circuitry, may be in proximity to the link structure, and arranged in a series of patterns covered by relatively thin (<0.1 μm typical) Silicon Nitride 14 and thicker (~1 μm typical) Silicon Dioxide 15 materials.

The irradiance distribution at the link may substantially conform to a diffraction limited, circular Gaussian profile. In another useful embodiment, the beam has an approximate elliptical Gaussian irradiance profile, as might be produced with an anamorphic optical system, or with a non-circular laser output beam. In one embodiment, the incident beam has a non-uniform aspect ratio 12, 11 as also illustrated in FIG. 4b (e.g., 3:1). Alternatively, rectangular or another chosen spatial profiles may be implemented in a lateral dimension. For example, Reference 1 discloses various advantageous methods and optical systems for "non-Gaussian" spatially shaping of laser beams for application to memory repair.

With the nearly diffraction limited elliptical Gaussian case, the preferable minimum beam waist dimension at location 11 approximates the narrow target 10 dimension of FIG. 1b, which, in turn, produces high pulse energy density at the link. Further, with this approach, a high fraction of the laser energy is coupled to the link and background irradiance is reduced.

A typical copper link used in a present memory has width and thickness of about 1 μm or less, for example, 0.6 μm, and length of about five microns. Future memory requirements are expected to further reduce the scale of target dimensions. The minimum beam waist dimension Wyo at 11 will typically overfill the sub-micron link to some degree, whereas aspect ratio Wxo/Wyo 12, 11 with Wxo a few microns along the link, can facilitate clean link removal. Additionally, rapidly decreasing energy density on the layers 14, 15 and substrate 17 is achieved through defocus of the high numerical aperture beam portion 11.

Figure 5A:
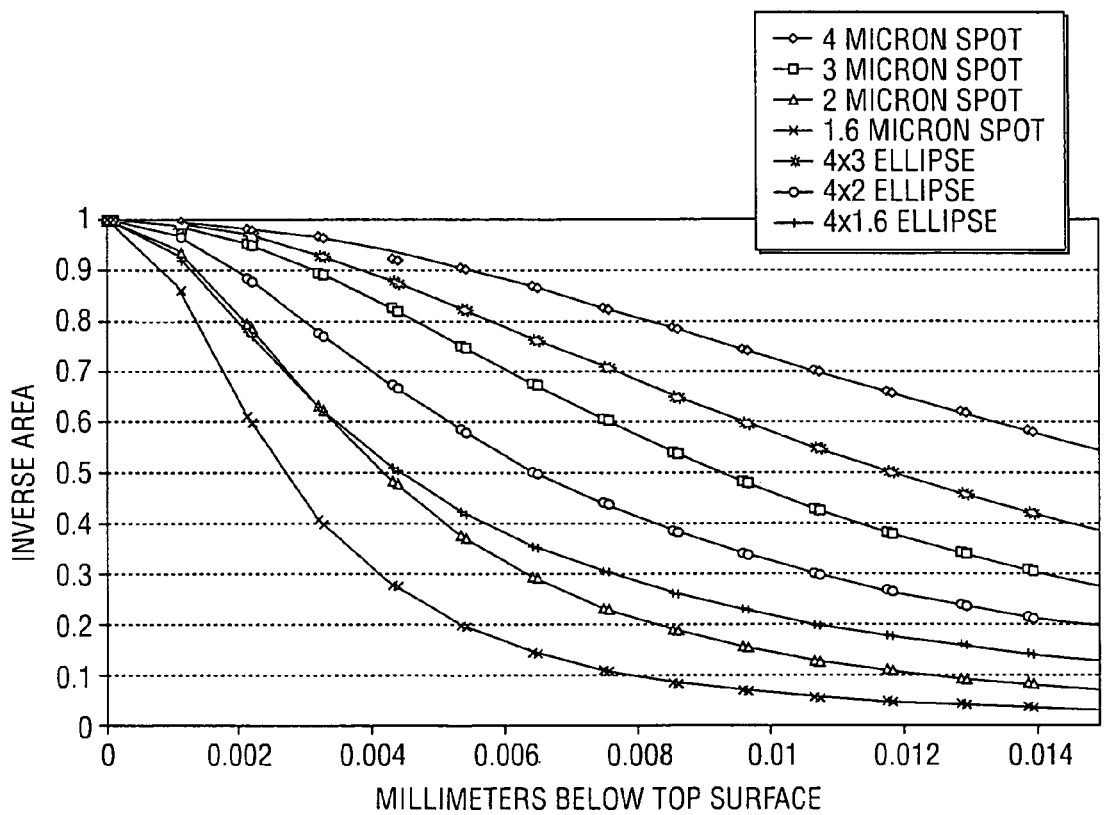
FIGS. 5a and 5b are graphs which show the reduction in irradiance on the device as a function of depth resulting from precise position control of a high numerical aperture beam (at the top surface), wherein the position and depth of focus of the beam provides for processing of the target structure without creating undesirable changes to other materials; In particular.
Figure 5B:
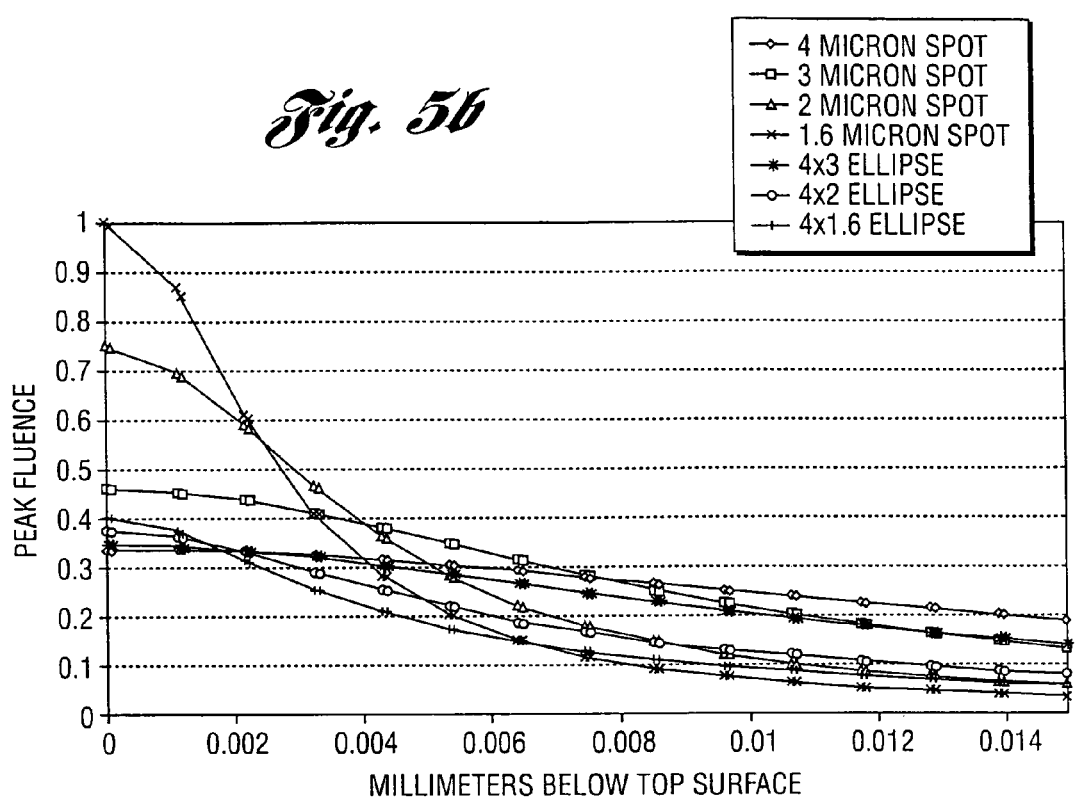

The graphs of FIGS. 5a and 5b illustrate the estimated defocus for various aspect ratios, relative to a circular Gaussian and an elliptical beam at best focus. FIG. 5a shows the very rapid falloff of a 1.6 μm circular Gaussian (0.002 mm numerical divisions=2 μm). FIG. 5b shows a normalized result to scale the energy density at best focus for the different spot shapes. These results indicate that with precision beam positioning in depth, wherein the power density is maximized at the target site, at relative reduction in energy density of more than one decade occurs at the substrate level for an exemplary multi-layer stack used in a copper based process for memory fabrication. Further, the rapid defocus relative to the waist Wy0 is beneficial for avoiding inner layer damage, provided the "tails" of the incident beam irradiate functional inner layer 16 (e.g., copper) at a low level.

In one embodiment for processing a multilevel device, copper link removal is initiated with application of the fast rise time pulse, having a nominal 10-90% rise time 4 in a preferred range of less than 1 nanosecond to about 2 nanoseconds. A pulse duration 5 in the range of about 2 nanoseconds to 10 nanoseconds is preferable to sever the link while limiting thermal diffusion. Pulse energies in the range of about 0.1 microjoules (μj) to 3 μj were effective, with a preferred typical range of about 0.1-5 μj considered sufficient margin for spot shape and process variations. The preferred pulse duration may be selected based upon the nominal link thickness specifications, or based on a model of the dissimilar thermal and optical properties of adjacent materials. During the pulse duration, thermal shock of top layer 13 and thermal expansion of the target 10 result in explosion of the link through ruptured top oxide layers 13, which in turn reduces the stress at the lower corner of the link structure adjacent to the layer 14. The laser pulse is rapidly terminated, preferably within a few nanosecond fall time 6 after the explosion, at a time just after the thin link is cleanly severed, and prior to a time the lower corner of the link results in cracking of at least layer 14. Further details and results related to the interaction of a laser pulse with a metal link and overlying layers is disclosed in references 4 and 5. The '471 patent and the associated specification describe the interaction process (e.g., FIGS. 1a, 1b, 11a, 11b, and in column 18).

Hence, a combination of the spatial characteristics (e.g., beam waist shape and position) and the temporal (e.g., rise time 4, flatness, and duration 5) pulse characteristics avoids undesirable cracking of lower layers 14, 15, avoids significant pulse interaction with inner layer conductor 16, and limits substrate 17 heating. Hence, despite the high reflectivity of the copper link at visible and near infrared wavelengths, and the expectation in the prior art of incomplete removal and damage to surrounding structures and substrate, the target structure is processed without undesirable damage to other structures. It is also known that copper, in addition to having nearly maximum reflectance in the near IR, is also more reflective than other link materials (e.g., aluminum, platinum). Nevertheless, due to the optical interaction of the near IR beam with the target and the optical and thermal properties of adjacent (overlying) layers, the preferred copper material can be processed.

Furthermore, near IR (Infrared) wavelengths also conveniently correspond to wavelengths where high bandwidth laser diodes are available, and to the spectral range where optical amplification of the pulsed laser beam can be efficiently produced with fiber and waveguide amplifiers. Those skilled in the art will recognize that amplified laser diode outputs, having a desired temporal pulse shape, may also be frequency multiplied to produce visible laser outputs when advantageous. The fast rise time of semiconductor diodes is particularly advantageous for producing a fast rise time, square pulse characteristic. Future developments in visible diode and optical amplifier technology may support direct pulse amplification in the visible range.

In a preferred system for copper link blowing, the link width is a fraction of one micron and the link spacing (pitch) is a few microns with present process technology. The link width may typically correspond to a wavelength of visible light. Further, at the microscopic scale of operation, where the lateral and/or thickness dimensions of the materials of FIGS. 1b and 1c are on the order of the laser wavelength, the thickness and indices of refraction of the stack materials can significantly affect the overall optical characteristics of the stack.

In one embodiment of the invention, a preferred reduced wavelength is selected in the visible or near infrared range wherein a non-absorptive optical property of the layers (e.g., interference or reflection loss) is exploited. The device structure of FIGS. 1a and 1b can be damaged with substantial absorption within the lower layers, such damage is prohibitive because of the presence of adjacent circuitry. This is in contrast to link processing with the prior art system of FIG. 2b where inner layer damage is not generally detrimental to overall device performance.

U.S. Pat. No. 6,300,690 (Reference 8) describes a system and method for vaporizing a target structure on a substrate. The method includes providing a laser system configured to produce a laser output at the wavelength below an absorption edge of the substrate. Furthermore, Reference 4 discloses benefits of a wavelength less than 1.2 um for processing links on memory devices wherein the substrate is Silicon, namely smaller spot size and shorter laser pulsewidths. In accordance with the present invention, improved performance can be realized by exploiting the non-absorbing stack properties with wavelength selection. Furthermore, at least one of precision positioning of a high numerical aperture beam, spatial shaping of the spot, or temporal pulse shaping also will provide for reduced energy at the substrate. The result corresponds to a relatively low value of energy expected to be deposited in the substrate, despite an incident beam energy necessary to deposit unit energy in the target structure sufficient to vaporize the target structure.

The factors affecting the energy deposited in the substrate are, in effect, multiplicative. Likewise, at short visible wavelengths, copper is absorbing (e.g., about 50% at 500 nm, 70% in the near UV, compared to 2% at 1.064 um) so less energy is required for clean removal, at least an order of magnitude. The preferred identified wavelength corresponding to a relatively low value of the energy expected to be deposited in the substrate is within a visible of near IR region of the spectrum. A model-based approach may be used to estimate the shortest wavelength with sufficient margin for a specified dielectric stack, spot position, tolerance, temporal and three-dimensional spatial pulse characteristics.

For processing on links on multilevel devices with Silicon substrates, the limiting wavelength corresponding to a relatively low value of the energy expected to be deposited in the substrate (e.g., below the image threshold) may be within the green or near UV region of spectrum, but the use may require tightly controlled system parameters, including possible control of the stack layer thickness or index of refraction.

With wavelength selection in accordance with the present invention, where the internal transmission and preferably reflection of the stack is at or near a maximum, stack layer damage is avoided. Furthermore, decreasing substrate irradiance, while simultaneously providing a reduced spot size for link removal (at or near diffraction limit), is preferred provided irradiation of functional internal layers is within acceptable limits. Spectral transmission curves for typical large bandgap dielectric materials generally show that the transmission decreases somewhat at UV wavelengths. For example, in HANDBOOK OF LASER SCIENCE AND TECHNOLOGY, the transmission range of Silicon Dioxide is specified as wavelengths greater than 0.15 μm. The absorption coefficient of both Silicon Nitride and Silicon Dioxide remains relatively low in the visible range (>400 nm) and gradually increases in the UV range.

FIG. 3 is a graph which illustrates the estimated back reflection produced by a representative multi-layer stack of 14 Silicon Dioxide 15 and Silicon Nitride 14 pairs over a range of near IR wavelengths, where the thickness of the layers is about 1 μm and 0.07 microns, respectively. In accordance with the present invention, a large number of layers can be accommodated, and may range from about 4-28 dependent upon the process (e.g., sometimes multiple layers may separate a functional conductor layer).

By way of example, it is shown that significant reflection occurs over relatively broad wavelength range. A single layer disposed as an internal layer 14 will typically reflect roughly 2% at each surface over the visible and near IR spectrum. It is well known in the art of link and semiconductor processing that Silicon absorption varies by orders of magnitude in the near IR spectral range. Further, studies of Silicon material processing have shown that the absorption is unstable and non-linear with increased laser power and substrate heating at wavelengths near the absorption edge, as taught in reference 4. However, as stated above, the shorter wavelengths are preferred to produce smaller spots (references 4-6, and 8) and higher energy concentration at the link position.

In accordance with the present invention, exploiting the layer reflection with wavelength can further enhance the system performance and supplement the benefits associated with temporal and spatial control of the pulse in a preferred short wavelength range. Such wavelength selection is regarded as particularly advantageous at wavelengths where the substrate absorption would otherwise greatly increase, and significant margin can be obtained when the number of layers 14, 15 disposed between the link and substrate substantially exceeds the number of overlying layers 13. A preferred structure for processing will comprise a substantial number of layers, with large reflectance at a predetermined short wavelength, the wavelength being well matched for generation of the preferred fast square temporal pulse shape.

Standard laser wavelengths in the range of FIG. 3 include 1.047 μm and 1.064 μm, the latter being a standard wavelength of semiconductor diodes. Further, custom wavelengths include 1.08 μm, and other wavelengths generated with Raman shifting. Those skilled in the art will recognize that frequency multiplication of the near IR wavelengths can be used to generate short wavelengths, and with appropriate design multiple wavelengths may be provided in a single system. For instance a preferred temporal pulse shape, with a fast rise time, may be generated in the green portion of the visible spectrum by frequency doubling a near IR laser.

In an alternative embodiment, wavelength tuning is used to match the wavelength to the approximate peak reflectance of the stack. Such an arrangement may be particularly advantageous for adjustment of a laser wavelength at the edge of the reflectance range (i.e., "cutoff" range) over a limited wavelength range, whereby sensitivity to tolerances in the material thickness and index of refraction are avoided. As noted above, further discussion of laser amplifier systems and application to other link structures can be found in references 4-6.

Generation of the pulsed laser beam may include the step of shifting the wavelength of the laser beam from a first wavelength to a predetermined wavelength. The predetermined wavelength may be based on material characteristics comprising at least one of: (1) coupling characteristics of the microstructure, (2) multi-layer interference, and (3) substrate reflectivity.

Experimental results have shown that at a wavelength of 1.047 µm, where the absorption of Silicon in orders of magnitude higher than at 1.2 µm, substrate damage is avoided with a short q-switched (standard) pulse and the stack characteristic of FIG. 3. However, the results with a standard laser having a q-switched temporal pulse shape showed cracking of an oxide layer 14 below the link. The relatively slow rising q-switched pulse shape, which for a Gaussian approximation is a substantial fraction of the duration, was considered a limiting factor for link removal without cracking of the inner layer based on experimental results. However, based on the teachings of the prior art, severe damage to the Silicon substrate would be expected at the 1.047 µm wavelength because the absorption is orders of magnitude higher than at a wavelength corresponding to maximum transmission. In accordance with the teachings of the present invention, the spatial pulse characteristics and the stack reflection are important factors to consider so as to avoid inner layer and substrate damage and short wavelengths of operation (which also provide for a smaller spot size and higher energy concentration at the link). Further, in accordance with the present invention, a predetermined square pulse shape generated at a laser wavelength of 1.047 µm would be expected to produce clean removal without undesirable changes to the stack and substrate.

Laser Processing and Process Design at the Sub-Micron Scale

Furthermore, in an exemplary advantageous embodiment for short wavelength processing of reflective microscopic structures, a specification for a multi-layer stack may be considered in process design. For example, a quarter-wave stack of alternating dielectrics or other suitable arrangement having a large difference in the index of refraction, and high transmission within each layer, is specified at a selected wavelength. It can be shown that very high reflectance is achievable, the quarter-wave stack being easily computed in closed form and modeled. Hence, the method and system of the present invention can be used effectively with other aspects of process design, and may be advantageous where the absorption of deeply buried layers and the substrate is relatively high, or where the width of a target structure is well below the laser wavelength.

The design of the device structure may have certain constraints related to the layout of the circuitry. As such, certain thickness and material for a certain layer may be defined, for instance an insulator in a plane of a conductor having the approximate thickness of the conductor, or related to the thickness of the conductor. It may be possible to select a material having a different index of refraction than the specified layer. A specified thickness may be based on the estimated reflection at an advantageous laser wavelength which may reduce or eliminate a requirement for special laser equipment operating at "exotic" wavelengths where the lasers are difficult to manufacture with high yield. The reflection may be estimated using a model wherein the thickness is a variable, and an estimate made to maximize the reflection, subject to other device constraints.

Thickness of the layers can be tuned to a wavelength in as much as the wavelength (or angle) can be tuned to the layers. Index of refraction could be used to fine-tune over a limited range, but the range may not be significant for small changes in index. Even with all thicknesses fixed by the process, the addition of a variable thickness tuning layer or layers with predetermined thickness could be used to significantly affect reflectivity of the whole stack. For example, a layer not constrained by metallization requirements could be used as a precision spacer between an upper and a lower stack portion. This could be a very powerful tool for tuning the process with adjustment of perhaps only one layer.

Physical Optics and Laser Processing of Multi-Level Devices

Other controllable laser characteristics may be exploited, alternatively or in conjunction with wavelength selection, to provide further improvements in the processing energy window. Reference 3 describes an advantageous method and system for polarization control, including dynamic polarization selection and computer control so as to align the polarization with a link orientation (e.g., details shown in FIG. 4 and the associated description in the reference). The polarization can be selected on the basis of the target coupling characteristics, the film reflectance, or a combination thereof.

With a link dimension below the spot size, effects like diffraction, scattering, and edge reflection should be considered as physical phenomena which can have either advantageous or detrimental results depending upon the device geometry and beam characteristics. Likewise, at high energy density, non-linear absorption may affect results, with particular concern of semiconductor material damage.

Figure 4C:
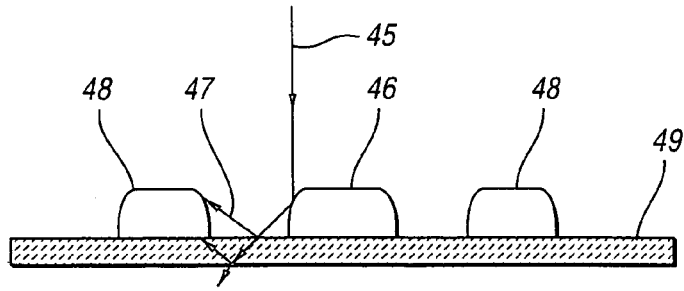
FIG. 4c is a side schematic view of a plurality of microstructures formed on a layer and which illustrate that for decreasing spacing (pitch) inter-reflections and stray energy result in irradiation of neighboring target structures.

An additional important consideration with fine pitch (spacing) of adjacent links and circuitry is collateral damage. Furthermore, functional circuitry in a plane of the layers must not be damaged. With an increasing trend toward fine pitch and high density memory, the three-dimensional structure of the device should be considered and may affect a choice of beam spatial and temporal characteristics. By way of example, FIGS. 4a-4c illustrate effects of reflection and diffraction associated with sub-micron width link 10 resulting in truncated 43,44 Gaussian beams 11, where the spot size (as measured at the 13.5% point) is wider than the link by varying degrees. The sketches are representative of a diffraction limited beam waist at a near IR wavelengths. The central lobe is clipped by the link, which appears as a near field obscuration, resulting in transmitted beam portions which are truncated 43,44. Energy which is not incident on the link may propagate at wide angles into the layers 49 which may be advantageous from the standpoint of avoiding damage to the substrate 17 as shown in FIG. 1. In any case, there will be some correlation of neighbor irradiance with spot size. Large spots with a relatively large depth of focus have reduced divergence and neighbor irradiance can be small, provided that the link spacing is large enough that the non-absorbed energy 43 of the incident beam impinging on an adjacent structure is weak, for instance corresponding to level 44. With a higher N.A. and smaller spot size, the reflected beam diameter at the link location 46 is increased. There will be a maximum value for some spot size 41,42. Then irradiance at a neighboring link 48 decreases as the reflected energy grows larger in area.

Figure 6A:
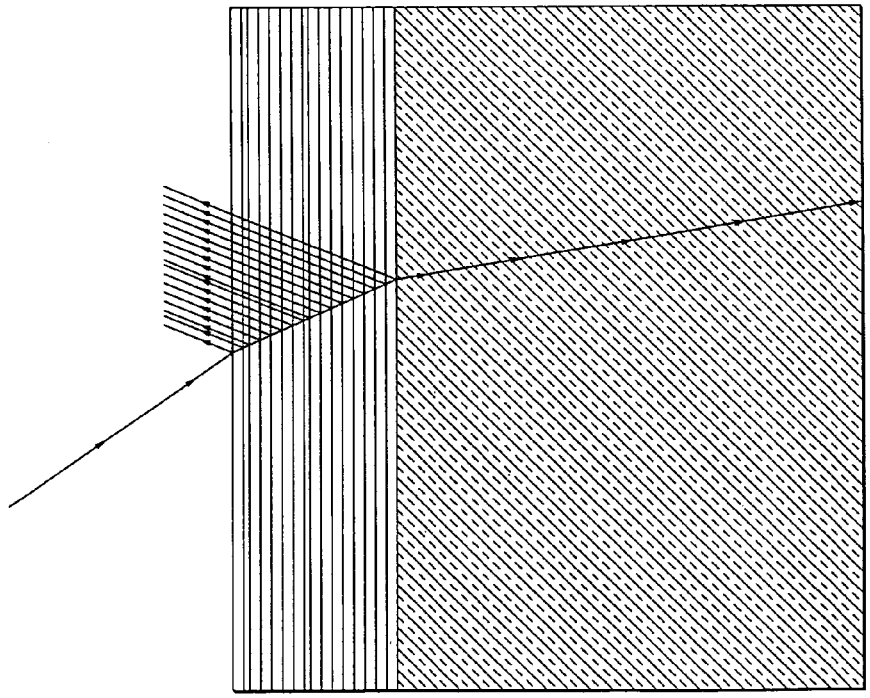
FIGS. 6a and 6b are schematic views of a stack of layers formed on a wafer substrate and which illustrate exemplary results obtained with a ray trace simulation used to estimate the level of radiation impinging on the internal layers and adjacent links with a specified beam numerical aperture.
Figure 6B:
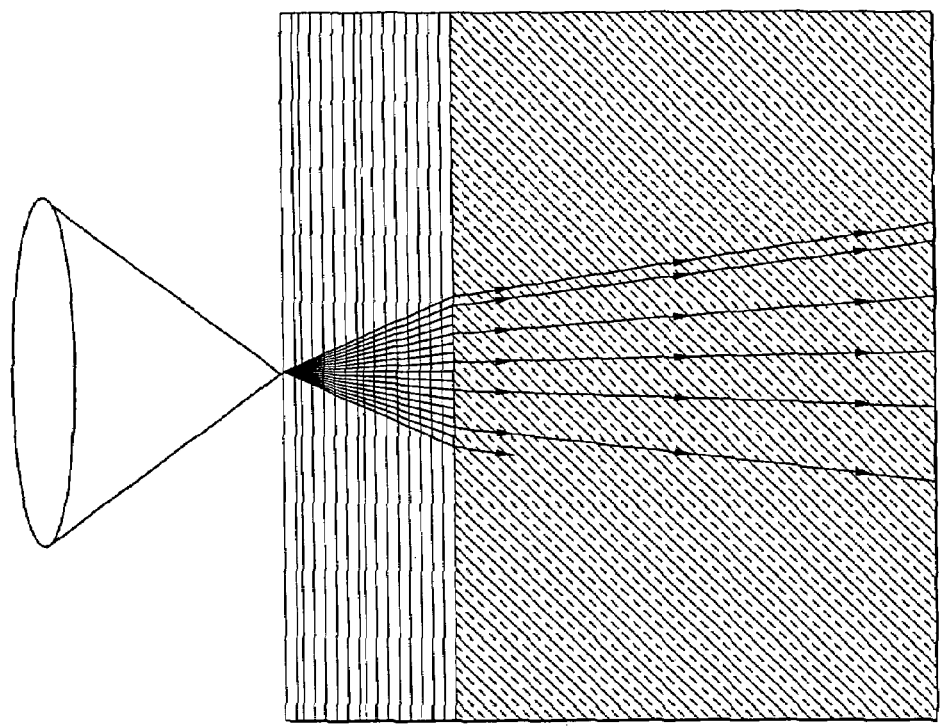

Simultaneously there is an angular variation in internal reflection. Hence, the stack layer thickness can also effect the irradiance of adjacent structures, including the internal structures 16 of FIG. 1. Furthermore, polarization variations with angle are expected to produce variations. FIGS. 6a and 6b illustrate by way of example geometric ray tracing effects of internal reflections propagating over an extended area.

Similarly, as shown in FIG. 4c, if a portion 45 of the laser beam incident on the edge of the link 46 is considered, the energy which is not coupled into the link structure may also be scattered and/or specularly reflected to the adjacent links 48. The inter-reflection 47 occurs as a consequence of at least the link 46 physical edge profiles which may be slightly curved or sloped.

An additional consideration is the three-dimensional spacing between an inner conductor layer 16 of FIG. 1, the beam waist 11, and the adjacent links 48 of FIG. 4c. A large numerical aperture beam waist 11, producing the smallest spot size at the link, while diverging and reflecting in a manner so as to avoid significant interaction with the inner layer 16 is preferred. Examination of FIGS. 4a-4c suggest a reduced spot size with controlled precision 3D waist positioning is expected to reduce collateral damage by maximizing energy coupled into the link. With high enclosed energy within the link and a low intensity transmitted profile 44, edge reflection is minimized. The spatial profile should also be selected subject to the constraint of only low level, negligible interaction between the beam angular distribution at 16.

It is preferred that the interaction mechanisms associated with a portion of the three-dimensional device structure be modeled for selection of at least a spatial pulse characteristic, such a characteristic may be the N.A. and position of the beam waist. Preferably, the model will include an estimate of the irradiance seen by each adjacent link structures 48, internal layer 16, and substrate 17. Whereas damage to adjacent link structures may be relatively apparent with conventional microscopy, assessment of inner layer 16 and substrate 17 damage may be considerably more difficult with the 3-D device structure.

With link widths below 1 μm, and pitch of a few microns, precise, sub-micron alignment is required to compensate for variations between wafers, and local variations within a wafer, and system tolerances (e.g., 300 mm wafer with 25 μm of topographical variation, and 5 μm of manufacturing tolerances, for instance). In accordance with the present invention, a precision positioning method and system is used to relatively position the beam waist so as to provide high laser energy concentration at the link. Also, one important consideration for precision positioning is predicting accurate (Xlink, Ylink) location information. The prediction is subsequently used by a motion control and positioning system to generate a laser output via trigger 2 at the target coordinates, during relative motion of the target 10 and laser beam. A preferred embodiment includes a polarization insensitive scanning and detection system as described hereinbelow, wherein a region containing an alignment target location is imaged to obtain reference data. The target location is often covered by a dielectric layer of Silicon Dioxide, Silicon Nitride, or other insulating material. Experiments have indicated that polarization insensitive detection is advantageous to avoid spurious measurements. The results led to a hypothesis that that birefringence is introduced in the insulating layers by polishing or other process operations, which is manifested by polarization variations in the reflected beam. These variations reduce the signal-to-noise ratio and appear to induce position distortion. The digital output data from each target location is used by an 8-parameter least squares alignment algorithm to estimate and correct position information affected by offset, angle, scale, orthogonality, and trapezoidal variations over the wafer containing the links to be processed.

Given the variations in the received beam at the target location, concerns arise that process variations may affect layer optical properties near the target structure. Furthermore, in practice, variations occur in the thickness and reflectivity of the target and layers, either over a wafer to be processed or from batch-to-batch. Measurement of the thickness and reflectivity is useful for process monitoring, and can also be used to determine adjustments for the laser power and wavelength to increase the energy window. For instance, any variation in the reflectivity of the link can affect the energy required for processing. A preferred method and system for adaptive energy control is also described hereinbelow.

As dimensions of links and other microscopic structures continue to rapidly shrink, those skilled in the art will appreciate the benefits of multi-parameter modeling. A model-based approach leads to selection and precision control of the spatial and temporal characteristics of the laser output, resulting in controlled three-dimensional interaction of the laser with complex multi-layer, multi-material structures.

Polarization Insensitive Detection and X, Y Reference Measurements

Commercial laser systems of the assignee of the present invention use a beamsplitter to pick off a portion of the reflected light from the work surface (e.g., a multi-layer memory device) as the laser is relatively positioned 152 over the alignment targets (e.g., fiducials). A block diagram of the subsystem is shown in FIG. 10. The reflectance/transmission (R/T) split of the beamsplitter 150 depends on the laser that is being used. In cases where the laser has low total energy and as much transmission as needed is necessary, the split of 90% transmission and 10% reflectance is made. This gives 90% going to the work surface on the way in and the 10% reflected is dumped. But this only picks off 10% of the reflected light, 90% of the reflected light is transmitted back down the laser path. When possible, the split 70/30 is made. This gives less total energy to the work surface but gives higher reflected signal.

Regardless of the R/T split, the specification is the R/T for S polarization=R/T for P polarization (within 5%). This is accomplished with a special dichroic coating, which produced good results. Because any polarization state can be thought of as a vector sum of S and P, the beamsplitter works at the correct R/T ratio for any polarization.

This is important because switching polarization to any desired state is done in the preferred link processing system to improve link cutting efficiency. For example, co-pending U.S. application Ser. No. 01/013,956, filed 13 Dec. 2001, a continuing application of U.S. Pat. No. 6,181,728 (Reference 3) and assigned to the assignee of the present invention reports results wherein a process window improvement occurs with polarization perpendicular to the link, particularly as the spot size is reduced. The preferred polarization controller disclosed in the '728 patent is used to switch states.

The method and system of the present invention are advantageous when there are oxide layers over the targets to be scanned and measured. The oxide layer may affect the polarization of the beam. This may happen because the oxide layer is stressed and creates birefringence. With the polarization insensitive arrangement this is not a problem, no matter how the polarization is changed one gets the same reflectance from the beamsplitter and the same signal level. If a more typical polarizing beamsplitter or simpler coating is used for the beamsplitter, the changed polarization will result in a change in the reflected signal. If the stress in the oxide layer varies, especially where it is over the target microstructure (it may be stressed because it is going over a target edge) then the polarization may vary as the beam scans the target. Again, this is not a problem because of the coating. In the polarizing beamsplitter case the reflected signal 151 measured at the detector would vary because the polarization is varying at the same time that one is trying to gather edge data, skewing the results uncontrollably and unpredictably.

This polarization insensitive technique is regarded as the most robust method and is preferred for measuring targets covered by at least one oxide layer. However, other imaging and edge location methods may be used, but may require more complex measurement algorithms to accurately measure the targets in the presence of multiplicative image noise.

Figure 14B:
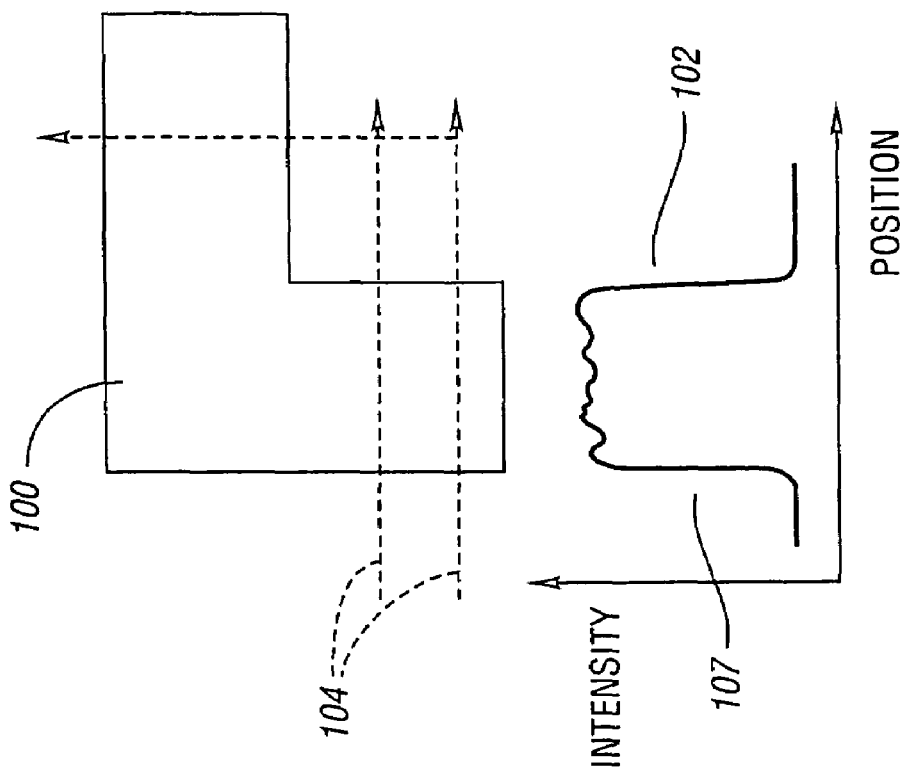
FIG. 14b shows similar representations with improved signal fidelity after cleaning with a pulsed laser beam.
Figure 14A:
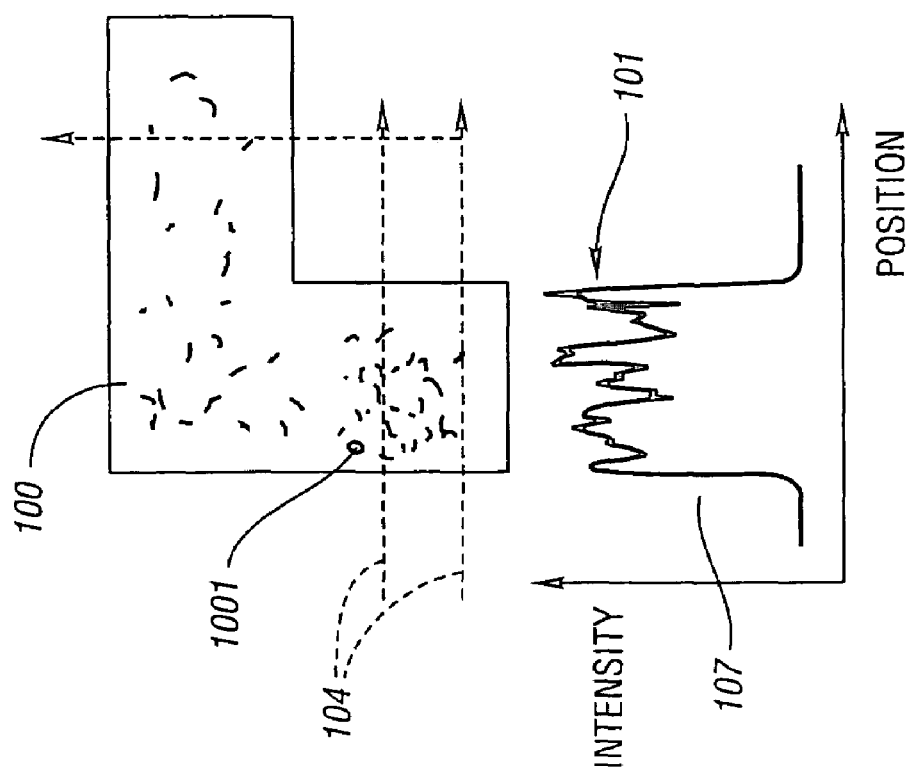
FIG. 14a shows schematic and graphical representations of an effect of debris on signal fidelity during alignment measurements.

Measurement with Anomalous Reflectivity Variations—Cleaning with a Pulsed Laser Beam A typical alignment target 100 is depicted in the schematic drawings of FIGS. 14*a* and 14*b*. The target 100 is typically covered with one or more passivation layers, these may correspond to the layer 13 in FIGS. 1*b* and 1*c*, but are not so restricted. During experiments with link removal on a multilevel, the preferred polarization insensitive measurement method was used to obtain X, Y target locations. However, it was discovered that debris 1001 within the target area 100, possibly from residual solder flux from nearby solder deposits (solder balls), significantly affected the reflected signals obtained with a detector resulting in noisy profiles 101. The impact on the measurement was manifested as a large residual in the least squares fit algorithm used to estimate location. In this illustration, the target area is shown as a positive contrast (e.g., higher measured intensity) region, but those skilled in the art will recognize that contrast reversal is acceptable provided that the contrast between the target 100 and the background is adequate for measurement.

A pulsed beam with lower peak power was used to remove the debris. An enhanced exemplary signal profile 102 (e.g., associated with relatively uniform intensity and a mostly debris-fee region) was obtained as a result of the cleaning operation, as shown in FIG. 14*b*. Representative energies for cleaning were on the order of 0.01 µj, for instance, 0.005 µj. This is well below the damage threshold of the materials, and well below the typical energies used for removal of links 12.

In one embodiment, a single linear scan or a plurality of linear scans 104 across the target 100 are used to obtain reflected intensity data which is analyzed statistically to measure fidelity, for instance by determining the % intensity variation or standard deviation. In an exemplary embodiment, data is taken along the line(s) 104 at about every 0.001". However, the sample space may be finer or coarser depending upon the signal fidelity obtained. If the spacing is too fine, additional "texture noise" may be introduced. If too coarse, an edge contrast 107 will be reduced or errors introduced by undersampling. If the variation is excessive, a cleaning operation is initiated with a pulsed beam. Preferably, the laser power is controlled with an acousto-optic modulator (i.e., "energy control" of FIG. 13) which is a standard part of the laser processing equipment. The operation of the modulator for intensity control and pulse selection within a link blowing system is described in more detail in U.S. Pat. No. 5,998,759 (e.g., Reference 4, col. 7, and the associated drawings). Those skilled in the art will recognize that such modulators provide for intensity control over a wide dynamic range, e.g., 100:1. A relatively simple user interface can provide for operator interaction to initiate operation, based on "pass/fail" or other criteria.

In another embodiment, the linear scan(s) may be done automatically and the cleaning operation performed at each measurement location.

In a preferred arrangement, only an adjustment of the energy will be needed, and other system parameters unaltered during the cleaning operation or as a result of cleaning. Those skilled in the art of measurement will be able to make various adjustments in the system parameters based on correlation of the results with other process parameters.

In a preferred arrangement, the cleaning operation will be applied only to scanned regions as needed. In one arrangement, the process is iterative with a measurement goal of obtaining suitable residuals in the least squares fit algorithm. If the residuals are above a designated value, scans of at least one region are obtained and cleaning occurs. In some cases, it may be desirable to adjust the positions of the scan lines (e.g., if cleaning is difficult). A fidelity measurement (e.g., contrast, standard deviation) may be used to guide the cleaning operation. Preferably, no more than one pass will be required.

It is to be understood that numerous arrangements could be used to practice the cleaning invention. For instance, an array camera could be used with different wavelength illumination to identify regions of non-uniform intensity. These regions could then be designated for cleaning. Those skilled in the art of optical measurement will be able to implement such arrangements, and such arrangements are within the scope of the present invention.

Reflectivity Measurement and Power Adjustment—Case 1: Single Wavelength

The above discussion related to a preferred measurement method and system for locating and measuring X, Y reference locations. An additional option to further improve the process energy window is measurement and control concept to adjust the laser energy and power as required by the material to be processed. If the reflectivity is high, then the energy is to be increased to compensate for these reflection losses. If the reflection is low, then the energy and power is to be decreased since more energy is being coupled into the workpiece or target microstructure. There are a number of ways that one can adjust this power and energy. The simplest is to measure the reflectance from the surface and adjust the energy and power control for optimum energy coupling.

Figure 12:
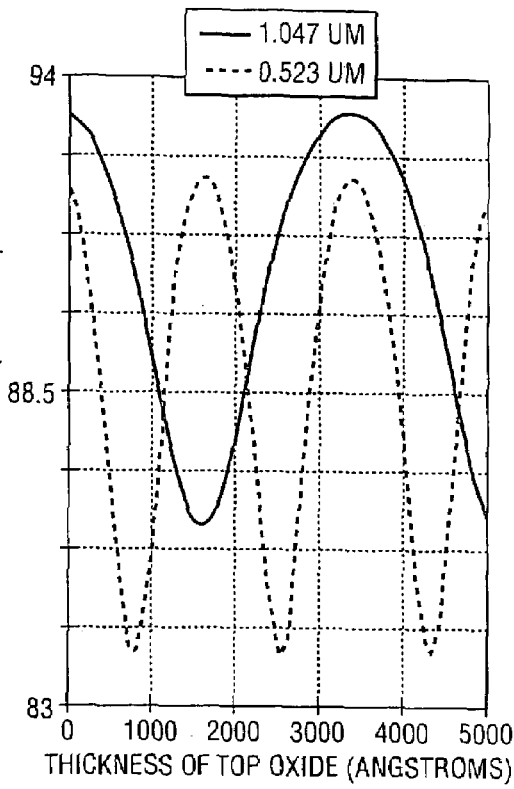
FIG. 12 shows a pair of graphs of reflectivity versus thickness of the outer oxide layer for two different laser beam wavelengths.

Light interference between metal and oxide layers can greatly affect the reflection and hence the absorption in the metal links (see FIGS. 11 and 12). Even though the process engineer tries to optimize the absorption in the link by designing the best oxide thickness, the necessary thickness tolerance is difficult to control. Typically, the thickness of a layer may vary by 10% and there may be several layers of oxide between the top layer and the metal layer to be processed.

If the thickness and index refraction over the link could be determined, then the energy required to process the link could be calculated and adjusted accordingly. There are two methods of determining the optical constants of a film. These are ellipsometry and spectral analysis. Ellipsometry uses the change in polarization as a light beam either transmits or reflects from a surface. The amount of change in polarization determines the index of refraction of the material and thickness of the material that the light beam traverses. The spectrometric method measures the reflection from a surface at different wavelengths to determine the same optical constants. In commercial versions of the spectrometer, the reflected light is sensed at 256 different wavelengths and calculations made on thickness, index of refraction and extinction coefficient (absorptivity) of the layers to very high accuracy.

Another method is to measure the reflectance at two different wavelengths and calculate the thickness of the oxide. If the index of refraction of the oxide used for the device could be measured, then the reflectance and hence the fraction of the laser radiation absorbed over the link can be calculated. Knowing this absorption, the optimum laser energy to remove the link can be programmed into the laser system. This second method is more accurate for thin film trimming where the material to be trimmed is thin and some of the energy is transmitted through the film.

Figure 13:
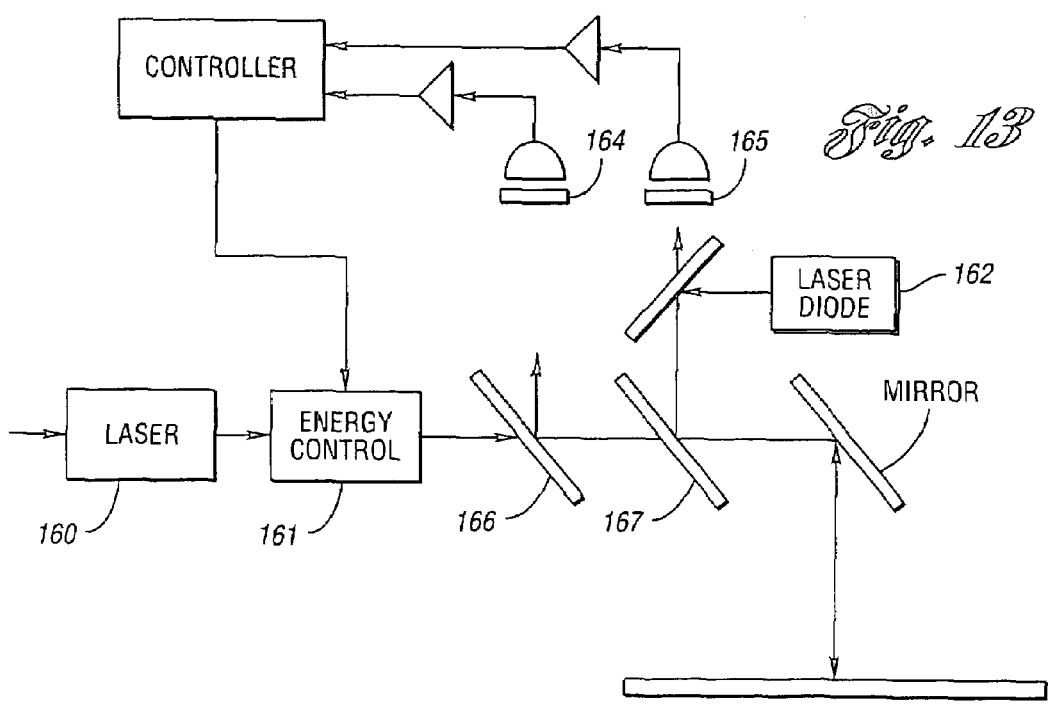
FIG. 13 is a schematic diagram of a system for automatically controlling pulse energy based on a thickness measurement.

The implementation of the thickness measurement and energy control is as shown in FIG. 13. The laser 160 used to remove the link provides one of the laser wavelengths for the thickness measurement. The energy delivered to the part is controlled by an acousto-optical modulator (i.e., "energy control") 161 as shown in FIG. 13 and is reduced to a level to measure the reflectance without damaging the part. The other wavelength to measure the reflectivity can be provided by a red laser diode (i.e., 670 nm diode) 162 added into the optical path as shown. Beamsplitters 166, 167 (e.g., dichroic mirrors) are generally used to transmit the two wavelengths to the device surface and to direct the reflected beams to the photodiode detectors 164, 165. The reflectance can be monitored by the two photodiodes 164, 165 as shown in FIG. 13. From the reflectance intensity of the two photodiodes (i.e., the 670 nm diode and 1047 nm detectors) and knowing the index of refraction of the oxide layers, the thickness of the oxide is uniquely determined. Once the thickness and the index of refraction is known, then the absorption in the link material can be calculated and the optimum energy programmed into the acousto-optic energy control device by the computer.

For the highest accuracy, the size of the spot and the link dimensions can be used in the calculation. Referring to FIGS. 4a and 4b, one sees that there is some energy that will fall off the link and therefore the difference in the reflected light that does not fall on the link has to be calculated. Hence, two measurements have to be made to accommodate for the reflected energy that is not covered by the link. These measurements can be made on each die if required and the energy per pulse can be varied as the thickness of the oxide varies across the wafer. Alternatively, the method could be selectively applied on a wafer-by-wafer basis for process monitoring, for instance. This technique will reduce the requirement to use a laser processing energy that is on the high side to account for the variations in absorption in the link due to interference effects.

Reflectivity Measurement and Power Adjustment—Case 2: Tunable or Adjustable Wavelength The process energy window may be improved in certain cases by adjusting the wavelength over a range wherein the coupling of energy to the target is improved, the stack reflectance is increased by way of the interference effect, or where the substrate reflectivity increases. Special solid state tunable lasers—Optical Parametric Oscillators (OPO), Raman, or other tunable lasers may be used provided that power and repetition rate requirements are met for a given application. For example, parametric oscillators may be used which are of fixed wavelengths, that use 2 or 3 crystals at the same time. Under certain circumstances, tunable lasers are operable. Published U.S. patent application 2001-0036206 describes a tunable laser diode having a 40 nm range developed for the telecommunications industry (i.e. 1.55 µm wavelength). Standard OPO lasers provide for high power and narrow pulses but generally a very slow rep rate, but may be suitable for certain applications. However, 10 KHz versions have been demonstrated and proposed for 20 KHz repetition rates. U.S. Pat. Nos. 6,334,011 and 5,998,759 (Reference 4), and U.S. Pat. No. 6,340,806 (Reference 6) disclose various combinations of shifters. As disclosed in the '759 patent, Fosterite lasers have a tunable region that essentially straddles the absorption edge region of silicon, and can permit operation both beyond and below the absorption edge of silicon. At the present state of the art, they do not appear to be as efficient as they may become in time. As materials and improvements are being continually developed in the laser field, it is within the invention to use such devices and obtain corresponding benefits for processing. For instance, the multilayer thickness and reflectivity measurements may be extended to select a wavelength range which will provide for an improved energy window.

Application to a Cu Link with a Single Layer Between the Substrate and the Link

It should be noted that the above teachings can also be selectively applied to conventional link structures (see FIG. 2-B), for instance processing of high reflectivity copper links separated from the substrate by a single layer dielectric layer. Production trends are pushing away from polysilicon structures and toward metal structures of Al and Cu, which poses on-going challenges for link processing systems to avoid reliability problems and to increase yield. As discussed above, many Cu-based devices have a multi-layer stack wherein substrate and stack damage can be avoided with wavelength selection, spatial beam shaping, or temporal shaping in accordance with the above teachings. However, some manufacturers etch all the dielectrics under the copper link and build the fuse on a single layer dielectric, with no SiN layers between the link and substrate. With conventional laser processing, the likelihood of substrate damages increases due to the high power required for Cu processing.

Figure 16:
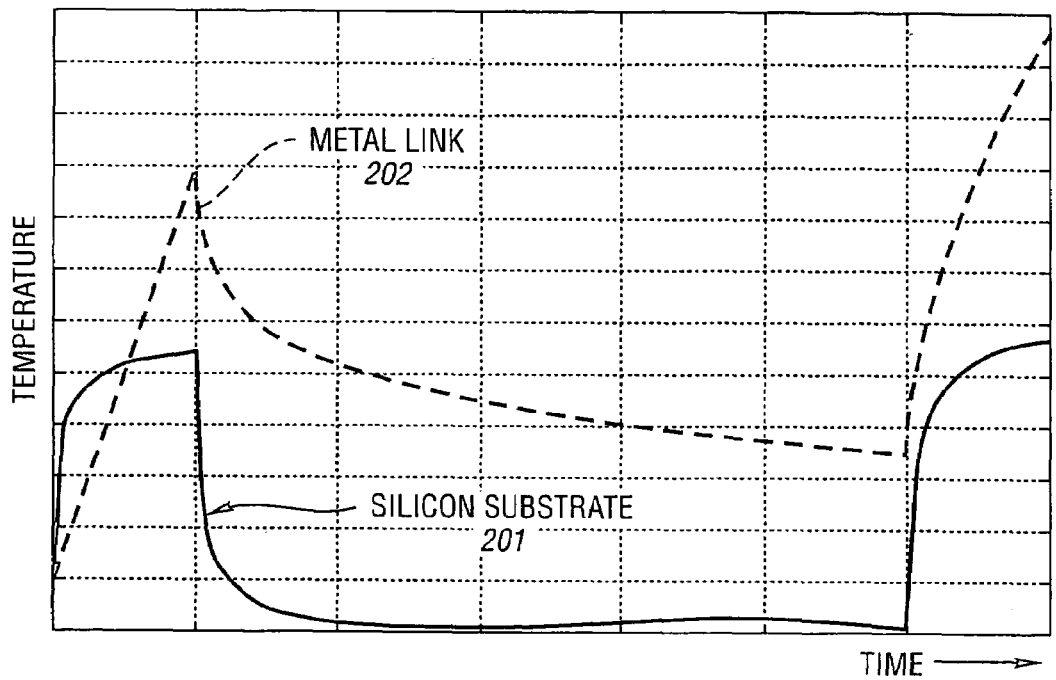
FIG. 16 is a graph of temperature versus time which illustrates simulation results for metal link (top) and substrate (bottom) irradiance with a pair of delayed pulses wherein the substrate temperature decays rapidly exhibiting a differential thermal property of the materials; the two laser pulses each had a square temporal shape.

In certain cases processing with multiple pulses ("double blast") has been used to process metal fuses. However, there is generally a throughput problem for the double blast approach because two passes are required in present on-line memory processing systems. Simulated results and experiments indicate a second blast may open the link completely even if 1st blast failed, despite extended time between first and second blasts. In specific cases improved yield was reported. According to the simulation results, double blast with 50% energy of a single blast energy was very interesting; it was observed that the Si substrate acts as a heat sink and cools down very fast. As shown in FIG. 16, the results indicated only 10 to 20 ns are needed for the Si substrate 201 to stabilize to room temperature. The copper target 202 recovery was much slower indicating a significant differential thermal property. The second pulse will also clear debris at cut site resulting in an "open circuit". It is estimated that about 60-70% of the energy used in a "single blast" is needed for each pulse of "double blast." The pulse energy may be varied with each pulse. In this example, the pulse delay was 50 ns, but it is clear that a much shorter delay may be possible.

In one embodiment, a delay line arrangement of FIG. 15a may be used to avoid any delay in throughput. For example, with a preferred positioning system of the '118 patent (i.e., Reference 2) assume about 150 mm/sec for fine stage speed movement. With 30 ns between two pulses, the change in beam position at the link location would be only 0.0045 um which is negligible. In an optical delay line (FIGS. 15b and 15c, for instance), 9 meters of extended path in air for the beam will delay 30 ns for the second pulse. Alternatively, as shown in FIG. 15a, a second laser could be used with a 30 ns or other controllable delay between the trigger pulses, and the trigger delay may be generated with a programmable digital delay line. The temporal pulse shape may be a fast rising, square pulse (as was used in the simulation) generated with a seed laser diode, for instance.

Numerous options for generating the pulse combinations may be implemented based on the teachings herein. For example, at least one pulse may have a duration of greater than a few picoseconds to several nanoseconds. The pulses may be amplified mode locked pulses. At least one pulse may generated with a q-switched microlaser having a pulsewidth less than 5 nanoseconds. At least one pulse may propagate along a second optical path whereby the pulse delay is determined by a difference in optical path length as shown in FIGS. 15b,c. Multiple laser and/or amplifiers may be used as shown in FIG. 15a.

Figure 18:
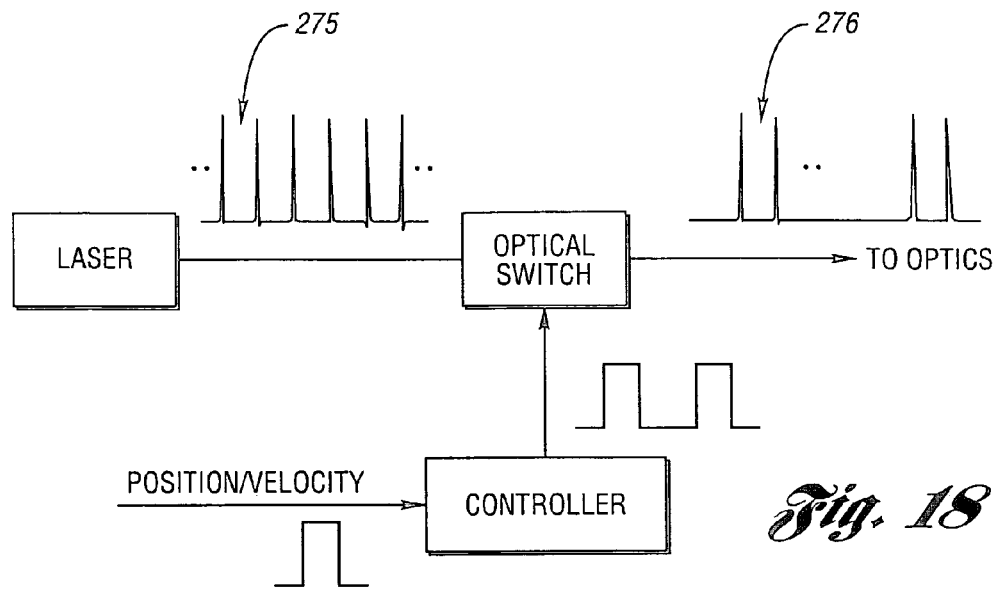
FIG. 18 is a block diagram of a system which generates and controllably selects pulses.

As shown in FIG. 18, the generated pulses 275 may have a repetition rate and a corresponding temporal spacing approximately equal to or shorter than a pre-determined delay (e.g., 60 MHz mode locked system) and a modulator is used to select the at least second pulse irradiating the microstructure or groups of pulses 276. U.S. Pat. No. 5,998,759 (e.g., Reference 4, col. 7, and the associated drawings) teaches the use of a modulator to allow pulses to irradiate a link on demand. At very high speed repetition rates an electro-optic modulator is preferred.

Figure 17:
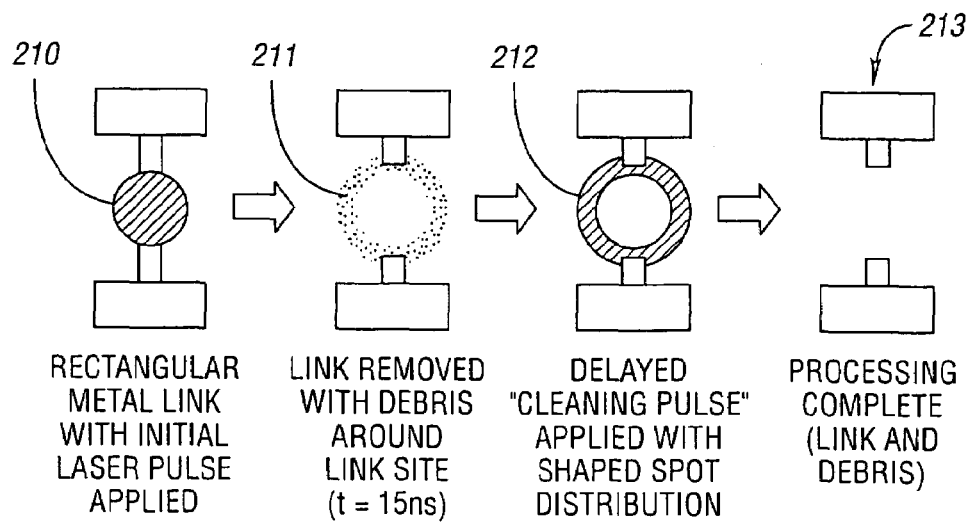
FIG. 17 is a series of schematic views of a metal link which illustrate a multiple pulse sequence wherein: (1) a first pulse irradiates the metal link; (2) debris is left after removing the link; (3) a second pulse with a spatial pulse shape is used wherein the central zone is attenuated, the second pulse having a lower peak energy density than the first pulse; and (4) 25 ns after the start of the first pulse the debris is removed.

Additional optics may be used to spatially shape at least one of the delayed pulses, prior to combining for instance. For instance, as shown in FIG. 17, a first pulse 210 may be an elliptical or circular Gaussian spatial shape, or a top hat along the length of the link. The second pulse 212 may have a different aspect ratio, or may be a special form of a "cleaning pulse" wherein the central zone of the spot is attenuated with an apodizing filter or effectively removed with a central obscuration. In such a case, the energy will be concentrated at the link periphery to remove debris 211 around the link location resulting from processing with the first pulse, thereby completing the processing 213. (For clarity, this "on-the-fly" link site cleaning step is to be distinguished from the "cleaning for measurement" method described above). Reference 1 provides at least one example of beam shaping for link blowing applications, wherein a uniform distribution rather than Gaussian spot profile is disclosed.

In certain cases, the relative motion between the microstructure and the laser beam may be significant between the pulses, e.g., greater than 25% of the spot size. This may be the result of a slower repetition rate (with increased pulse energy), faster motion speed, a longer pre-determined delay, or decreased target area. For example, an ultrashort or other short pulse laser system with amplified pulses with output energy in the range of several microjoules-millijoules may have a 100 KHz-10 MHz repetition rate whereas a system with 10-40 nanojoule output may have 50 MHz repetition rate. In the former case, a high speed, small angle beam deflector may be used to compensate for the motion and deflect a delayed pulse to substantially irradiate the first microstructure at the slower repetition rate during relative motion 258.

Figure 19:
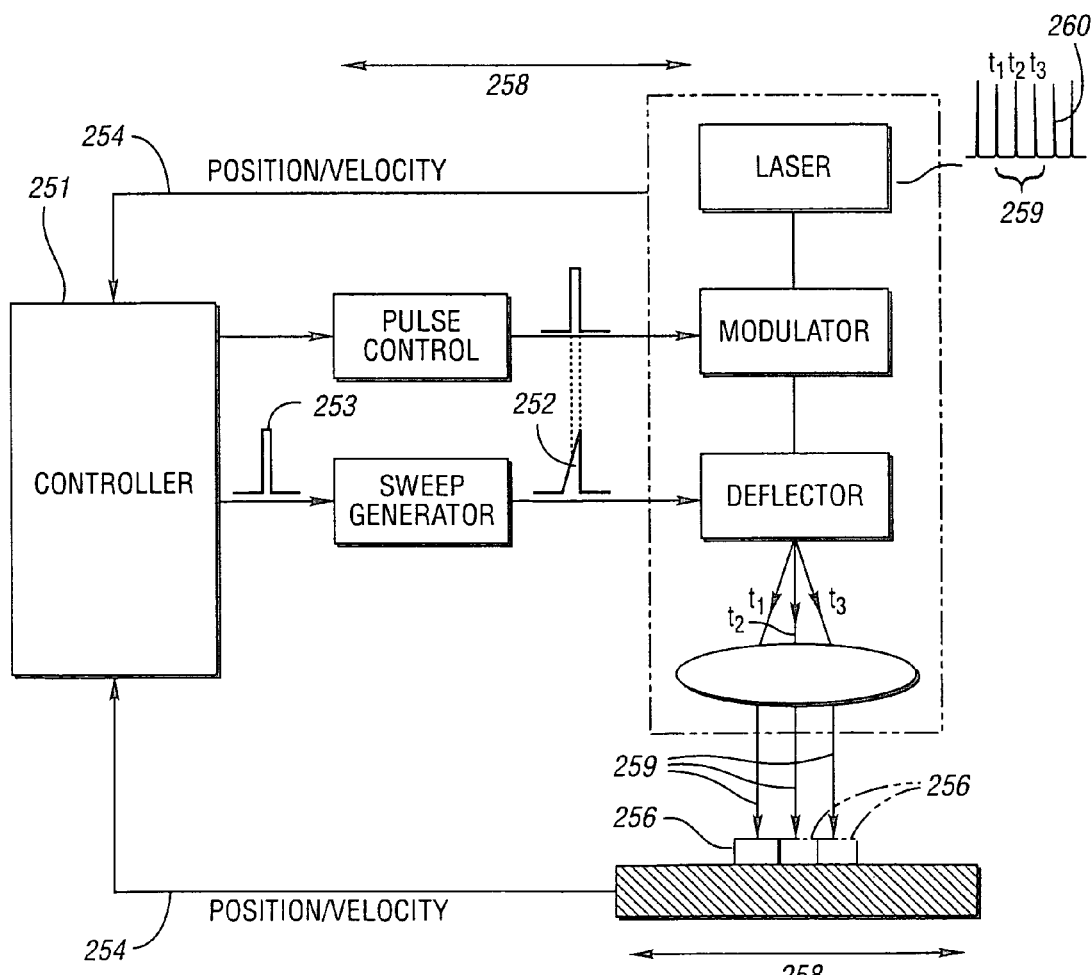
FIG. 19 is a block diagram of a system of the present invention wherein a portion of a high repetition rate pulse train (e.g., 1 µHz) is selected and a high speed beam deflector (e.g., electro-optic or acousto-optic device) synchronized with microstructure positions is used to process a single microstructure with multiple pulses during relative motion.

In one embodiment generally illustrated in FIG. 19, the deflector would be operatively coupled to the relative positioning system controller 251 in a closed loop arrangement. The deflector is preferably solid state and may be a single axis acousto-optic device which has a very fast "retrace"/access time. Alternatively, a higher speed electro-optic deflector (e.g., a gradient index reflector or possibly a digital light deflector) may be used. The time-bandwidth product (number of spots) can be traded for response time on an application basis. The deflector would preferably be used for intensity control and pulse gating/selection, as taught in Reference 4 (col. 7, and associated drawings). Alternatively, an electro-optic modulator may be used with a separate acousto-optic deflector operated in a "chirp mode" 252 (e.g., linear sweep as opposed to random access mode) and synchronized (triggered) 253 based on the positioning system coordinates 254. The positioning system coordinates are, in turn, related to the time at which the laser pulses are gated by the modulator to irradiate the same single microstructure 256 at times $t_1$, $t_2$, $t_3$ corresponding to the selected pulses 259 during relative motion 258.

In yet another embodiment, a single laser pulse is used to blast up to two links at one time (e.g., no, one or two links). Referring to FIG. 20, two focused spots 306, 307 are formed on two links by spatially splitting the single collimated laser beam 310 into two diverging collimated beams 309. The use of acousto-optic devices for spatially splitting beams in material processing applications is known in the art. For example, patent abstract JP 53152662 shows one arrangement for drilling microscopic holes using a multi-frequency deflector having selectable frequencies $f_1 \ldots f_n$.

A laser 300 is pulsed at a predetermined repetition rate. The laser beam goes through relay optics 302 that forms an intermediate image of the laser beam waist into the acoustic optic modulator (AOM) aperture. The AOM 303, which operates in the Bragg regime, preferably is used to controllably generate the two slightly diverging collimated first order diffraction laser beams and control the energy in each beam. The AOM is driven by two frequencies, $f_1$ and $f_2$ where $f_1 = f_{0+\Delta f}$ and $f_2 = f_{0-\Delta f}$ where $\Delta f$ is a small percentage of the original RF signal frequency $f_0$. The angle between the two beams is approximately equal to the Bragg angle for $f_0$ multiplied by $2(\Delta f/f_0)$. The AOM controls the energy in each of the laser beams by modulating the signal amplitudes of two frequency components, $f_1$ and $f_2$, in the RF signal and making adjustments for beam cross-coupling.

After exiting the AOM, the beams go through the beam rotation control module 313 to rotate the beam 90 degrees on axis with links orientated in either the X or Y. In one embodiment, a prism is used for this rotation, though many rotation techniques are well known as described in the regular U.S. application noted in the Cross-Reference to Related Applications section.

Next, the beam goes through a set of optics to position the beam waist and set the beam size to be appropriate for the zoom optics and the objective lens 305. Note, the zoom optics also modify the angle between the two beams, therefore the angle between the two beams exiting the AOM has to be adjusted depending on the zoom setting to result in the desired spot separation at the focal plane. Next, the laser beams enter the objective lens 305 which provides a pair of focused spots 306, 307 on two links. The two spots are separated by a distance that is approximately equal to the focal length of the lens times the angle between the two beams. In one exemplary embodiment, a 80 MHz AOM center frequency with a sweep range of about 2.3 MHz (77.7-82.3 MHz) may be used to produce a spot size of about 1.8 μm on a pair of adjacent links spaced apart by about 3 μm. As mentioned earlier, these links may have a dimension on the order of a laser wavelength (e.g., 1 micron) which, at very high speed operation, require the precision positions of the laser beam and microstructure.

Summary of Some General Aspects of Invention

In summary, one aspect of the invention is a method of selective material processing of a microscopic target structure with a pulsed laser beam. The target structure is separated from a substrate by a plurality of layers which form a multi-layer stack. The target structure, layers, and substrate have dissimilar thermal and optical properties. The method includes generating a pulsed laser beam with an energy density; irradiating the target structure with at least one pulse. Undesirable changes to the stack structure and substrate are avoided by selection of at least one pulse characteristic.

A portion of the stack may be irradiated with the laser beam during the processing of the target structure, yet undesirable damage to the layers, substrate, and functional circuitry in a plane of the inner layers is avoided.

Undesirable damage of the stack structure includes cracking, induced by thermal stress, of inner dielectrics. Undesirable damage to inner layer conductors of the stack includes thermal damage caused by irradiation. Undesirable damage to the substrate may arise from laser irradiation and resulting thermal diffusion.

The dielectric layers may include Silicon Nitride or Silicon Dioxide. The substrate may be Silicon.

The target structure is preferably copper, and may have thickness or width below one micron, with a dimension at or below wavelengths of visible light. Alternatively, the target structure may be a metal link, for instance aluminum, titanium, platinum, or gold.

An aspect of the invention is selection or control of the spatial and temporal beam characteristics of the pulse, which allows the target structure to be cleanly processed while avoiding undesirable damage to the layers, substrate, and functional circuitry in a plane of the inner layers.

A temporal characteristic of the pulse is the pulse shape. The pulse shape includes a rise time fast enough to efficiently couple laser energy into the target, a duration sufficient to cleanly remove a portion of the target structure, and a fall time fast enough to avoid undesirable damage caused by subsequent optical transmission. A preferred pulse rise time for link processing is less than 1 nanosecond (ns) to about 2 ns. A preferred duration is less than 10 ns. A fall time of less than 3 ns is preferred. The pulse shape may be substantially square, with ringing or variation between the rising and falling edges of about +−10%. A single pulse or multiple pulses in the form of a rapid burst may be used. Alternatively, a series of q-switched pulses spaced apart in time, with varying output power if desired, may be combined to form a pulse shape having a fast leading edge with high peak power, followed by a second pulse with lower power. In yet another embodiment of the present invention the q-switched pulses may have approximately the same output power and combined to produce a substantially square pulse shape.

Another temporal pulse characteristic is the pulse power at the leading edge. If the irradiance on the target structure is greater than about $10^9$ W/cm$^2$, the reflectivity of the target structure is reduced and coupling of the laser energy is improved.

A fast rising pulse characteristic avoids undesirable damage of a dielectric stack of a memory device having a metal target structure. Cracking of the upper corner occurs during the pulse duration which lowers the stress on the lower corner adjacent to underlying layers of the stack.

A spatial characteristic of the beam is the irradiance profile at a controlled beam waist position. The irradiance profile may approximate a circular Gaussian beam, an elliptical Gaussian beam, a rectangular profile in one direction and Gaussian in the orthogonal direction. The beam may be nearly diffraction limited. A spatial shape and beam numerical aperture may be selected to control the interaction of the pulsed laser beam with the target and underlying structures of the 3D device structure to avoid undesirable damage. The material interaction may further be controlled by precision positioning of the beam waist of the pulsed laser beam. The numerical aperture and beam shape may be selected so the spot size and link size are substantially matched in at least one dimension.

One aspect of the invention is a method of selection of a pulse characteristic based on a model of pulse interaction within a portion of the three-dimensional device structure. The three-dimensional device includes a target structure, stack, and substrate with a dissimilar optical property. A series of structures are disposed at a predetermined spacing to form an array, with at least one structure not designated as a target structure. A specification may further include information regarding the material and spacing of functional circuit elements in a plane of the stack. The method includes determining the optical propagation characteristics of a portion of an incident pulsed laser beam which is not absorbed by the target structure. The method further includes specifying a laser pulse characteristic to avoid undesirable damage to any non-target structures, stack, and substrate.

The interactions mechanisms which result in selection of a pulse characteristic include reflection from the target surface, layer surface and internal reflections, polarization, interference effects, near field diffraction, scattering and absorption or a combination thereof. A thermal model may be used in conjunction with an optical model.

The energy in a pulse used for processing a copper link target structure of a semiconductor memory device may be in the range of about 0.1-5 microjoules. The energy density corresponds to an area of the irradiance profile of the beam waist. The area may be in the range of less than 20 square microns, and preferably less than 10 square microns.

Another controllable laser pulse characteristic is polarization. The polarization may be controlled or selected based on the relative reflectance of the layers and optical coupling of laser energy into the target structure at a wavelength.

A wavelength of the laser pulse may be selected based on the reflectance of the multi-layer stack (interference effect). The preferred wavelength corresponds to a spectral region where the stack reflection is substantial, for example 60%, and where the internal transmission of within a layer of the stack is high, approaching a maximum. Short wavelengths are preferred for maximum control of the spatial characteristics of the beam (for example, the smallest achievable beam waist with an option for controllably selecting a larger beam waist and depth of focus). The laser wavelength may be fixed, or may be varied with wavelength shifting or harmonic generation. A measurement of the thickness or reflectance may be used to select or adjust the wavelength.

In at least one embodiment, the target structure may be substantially reflective at the laser wavelength. The laser wavelength may be below the absorption edge of the substrate and correspond to an absorbing or reflecting region. The laser wavelength is above the absorption edge of the dielectrics layers of the stack, and corresponds to a substantially maximum transmitting region.

A selected wavelength corresponds to the near UV, visible and near IR spectrum, from below 0.4 µm to about 1.55 µm. The lower limit may be determined by the absorption of a layer. With silicon substrates, both absorption and reflection increase at shorter wavelengths. For Silicon Dioxide and Silicon Nitride, the internal transmission and single surface reflectance are substantially constant throughout the visible and near IR ranges. The upper limit corresponds to a range of preferred laser wavelengths of laser diodes, optical amplifiers. An amplifier output may be either wavelength preserved or Raman shifted.

Another aspect of the invention is a method of selective material processing of a microscopic target structure of a multi-material, multi-layer device with a pulsed laser beam. The target structure, layers, and substrate have a dissimilar thermal and optical property. The beam has a focused beam waist with a centerline. An alignment pattern is included at one of a plurality of predetermined measurement locations associated with the device. The alignment pattern is covered by at least one layer. The target structure is separated from a substrate by a plurality of layers which form a multi-layer stack. The method includes measuring the position of the alignment target in at least one dimension; predicting the relative location of the target structure and centerline based on the measurement; inducing relative motion between the target structure and the centerline based on the measurement; generating a pulsed laser beam with an energy density; irradiating the target structure with at least one pulse. Undesirable changes to the stack structure and substrate are avoided with by selection of a pulse characteristic.

The measurement of a position may include a method and system for polarization insensitive detection to avoid spurious measurements resulting from reflected signal variations. The signal variations may result from process induced optical characteristics, including birefringence.

The relative location of the target structure, beam waist, and centerline may be predicted based on multi-parameter least squares fit.

A cleaning process may be used to enhance data used for measurement by removing contaminants which produce multiplicative variations (reflection noise).

Three-dimensional (depth) measurements may be done using the alignment target, wafer, or other suitable material. The measurement may be used to predict the relative location of the target structure relative to the beam waist, the beam waist being located along the centerline of the pulsed laser beam. A surface may be estimated from the three-dimensional measurements. A numerical offset may be introduced to compensate for a depth difference between a measurement location and the target structure, based on the thickness of the stack.

An aspect of the invention includes measurement of the layer thickness or reflectivity at a location, and use of the measurement to control a pulse characteristic. The pulse characteristic may be the pulse energy, pulse width, or wavelength. The location may be a single location on the device or a plurality of locations.

While the best modes for carrying out the invention have been described in detail, those familiar with the art to which this invention relates will recognize various alternative designs and embodiments for practicing the invention as defined by the following claims.

What is claimed is:

1. A method of laser processing a 1D or 2D array of conductive links to remove one or more designated links of the array without damaging a substrate, adjacent non-designated links, or one or more functional layers or levels disposed between the conductive links and the substrate, the processing of the one or more designated links to occur with one or more laser pulses in a single pass operation controlled with a positioning subsystem of a laser-based, memory repair system, the positioning subsystem causing relative motion between the conductive links and one or more laser beam spots, the method comprising:

obtaining information to identify the one or more designated links of the array and to identify one or more alignment targets about the one or more designated links, each of the one or more alignment targets having a predetermined location relative to the one or more designated links;

scanning a measurement beam to obtain one or more signals representative of the locations of the one or more alignment targets and processing the one or more signals to determine the locations of the one or more alignment targets;

predicting the locations of the one or more designated links relative to the one or more alignment targets, the step of predicting comprising relating the locations of the one or more alignment targets to the locations of the one or more designated links based on at least the pre-determined locations of the one or more alignment targets;

planning and generating a trajectory to position the one or more laser beam spots relative to the one or more designated links so that the one or more designated links and the one or more laser beam spots substantially coincide at locations along centerlines of one or more pulsed laser beams, and also so that the one or more designated links and the one or more laser beam spots coincide at a time when the one or more laser pulses impinge the one or more designated links, the step of planning and generating comprising:

producing a first motion profile corresponding to a first trajectory segment, the profile representative of approximately constant velocity of relative motion of the one or more designated links and the one or more laser beam spots generally along a row or column of the array, the motion occurring during a first specified time interval, or over a first specified distance, at which the one or more designated links are to be processed with the one or more laser pulses, and producing a second motion profile corresponding to a second trajectory segment, the second motion profile representative of an acceleration or deceleration during a second specified time interval, or over a second specified distance, at which the relative motion of the one or more designated links and the one or more laser beam spots is accelerated to achieve a predetermined velocity for processing with the one or more laser pulses;

moving the one or more designated links relative to the one or more laser beam spots in accordance with the generated trajectory;

generating the one or more laser pulses having at least one predetermined characteristic including a pulse width;

selecting at least one frequency from an available range of frequencies so as to control at least one of a pulse location, number of pulses, and spatial spacing of the one or more pulses that are to impinge the one or more designated links, the, one or more designated links being within a region of the array and along at least one of one or more rows and one or more columns of the array;

applying, during overlapping time periods, the at least one frequency to a multi-frequency deflector to produce as an output of the deflector the one or more pulsed laser beams having controlled deflection;

focusing the one or more pulsed laser beams to form the one or more laser beam spots at the one or more designated link locations, wherein the step of focusing provides that the one or more laser beam spots are approximately diffraction limited, the steps of planning and generating a trajectory, selecting, applying, and focusing thereby precisely positioning the one or more laser beam spots at the one or more designated link locations; and irradiating the one or more designated links with the one or more laser beam spots wherein the one or more laser beam spots and the one or more designated links substantially coincide, the step of irradiating with the one or more laser beam spots providing for processing the one or more designated links during the single pass.

2. The method of claim 1, wherein the step of applying splits the one or more pulsed laser beams into a plurality of offset beams to irradiate the one or more designated links.

3. The method of claim 2, wherein the centerlines and the one or more laser beam spots of the one or more pulsed laser beams define an approximate plane of incidence of the one or more pulsed laser beams, and wherein the method further comprises, prior to the step of generating, orienting the plane to cause the one or more pulsed laser beams to impinge the one or more designated links of the array along a pre-determined first direction.

4. The method of claim 3, wherein the step of orienting is carried out with a beam rotator comprising a prism.

5. The method of claim 3, wherein the step of orienting causes the plane of incidence to be switched between a row and column of the array prior to the step of moving the one or more designated links relative to the one or more laser beam spots.

6. The method of claim 3, wherein the step of orienting switches the plane of incidence between rows and columns of the array, and wherein the rows and columns are oriented along two orthogonal directions.

7. The method of claim 1, wherein the steps of focusing the one or more pulsed laser beams and irradiating are carried out with a single objective lens system.

8. The method of claim 1, wherein the deflector is a single-axis acousto-optic deflector having a center frequency, and wherein the step of selecting and applying is carried out over a frequency range that is a small fraction of the center frequency of the acousto-optic deflector.

9. The method of claim 8, wherein the frequency range is sufficiently large to process adjacent links along at least one of the one or more rows and the one or more columns.

10. The method of claim 8, wherein the center frequency is about 80 MHZ and wherein the frequency range is about +−2.5 MHZ.

11. The method of claim 1, wherein exactly two laser beam spots remove adjacent links of a row or column of the 1D or 2D array.

12. The method of claim 1, further comprising the step of obtaining three-dimensional information using data acquired at an at least one of an alignment target and other location of the device having a surface suitable for optical measurement, and using the data to compute at least one reference surface that substantially coincides with three dimensional coordinates of the one or more designated links.

13. The method of claim 12, wherein the three-dimensional information includes both height and X, Y information.

14. The method of claim 12, wherein the step of planning and generating a trajectory produces profiles based on the three-dimensional coordinates, and wherein motion during processing a trajectory segment is three dimensional relative motion along a plane that is tilted and non-orthogonal with respect to the centerlines of the one or more pulsed laser beams.

15. The method of claim 12, wherein at least one of the steps of processing the one or more signals and computing the reference surface comprises least square fitting.

16. The method of claim 1, further comprising the step of determining, prior to the step of scanning, a reference surface, other than a surface of the substrate that supports the one or more designated links, so as to obtain pre-determined reference surface information, the reference surface corresponding to a support surface configured to support the substrate, wherein the step of determining is based on the pre-determined reference surface information in combination with three-dimensional information, thereby reducing the total position variation associated with misalignment or other topographical variations that exceed a depth of focus corresponding to a laser beam spot, whereby increased speed of operation is obtainable over a substantially large portion of the substrate having the 1D or 2D array.

17. The method of claim 1, wherein a maximum number of selected frequencies of the set and number of laser beam spots are determined based on a response time of the deflector so that the laser beam spots are precisely positioned on the one or more designated links during relative motion at about 150 mm/sec or greater wherein the throughput for processing the one or more designated links is improved relative to processing without the steps of selecting and applying.

18. The method of claim 1, wherein the step of planning a trajectory includes constraining at least one of the first and second trajectory segments with a minimum time constraint.

19. The method of claim 1, wherein the pulse characteristic comprises at least one of pulse energy, peak pulse power, pulse shape, and wavelength.

20. The method of claim 1, wherein the pulse characteristic comprises at least one of polarization and wavelength.

21. The method of claim 20, wherein the wavelength is within the visible or near UV range.

22. The method of claim 21, wherein at least one passivation layer is located over each link of the array, and the visible or near UV wavelength is long enough to sufficiently tolerate variations in the thickness of the at least one layer.

23. The method of claim 1, wherein a characteristic of the one or more pulsed laser beams comprises a spatial characteristic, including at least one of a circular and non-circular spatial profile having a substantially uniform laser beam spot intensity distribution or a substantially Gaussian laser beam spot intensity distribution.

24. The method of claim 1, further comprising generating at least first and second laser beam pulses, the at least first and laser beam pulses being closely spaced in time and, therefore, forming a burst of laser beam pulses, the generating steps being carried out with at least one gain switched, mode locked. MOPA fiber laser system, or q-switched laser source; repeating the steps of applying and focusing so that the at least first and second laser beam pulses process the one or more designated links of the region during the single pass during the relative motion over a time interval wherein the temporal spacing of the pulses or the burst corresponds to relative motion of less than about 10% of the width of the one or more designated links or less than about 25% of the dimensions of the one or more laser beam spots.

25. The method of claim 1, further comprising: generating at least first and second laser beam pulses, the at least first and second laser beam pulses being closely spaced in time and, therefore, forming a burst of pulses, the generating steps carried out with at least one gain switched, mode locked, MOPA fiber laser system, or q-switched laser source; and repeating the steps of applying and focusing so that the at least first and second pulses process the one or more designated links of the region during the single pass during the relative motion over a time interval wherein the temporal spacing of the at least first and second laser beam pulses or the burst corresponds to relative motion of greater than about 10% of the width of the one or more designated links or greater than about 50% of the dimensions of the one or more laser beam spots; and deflecting at least one laser beam pulse of the burst to compensate for the relative motion between irradiation by the at least first and second laser beam pulses, wherein the deflecting step is carried out using a solid state acousto-optic device.

26. The method of claim 25, wherein the deflector is a single-axis acousto-optic device having a fast retrace time, wherein the deflector is controlled with a continuous sweep and synchronized to the positioning sub-system.

27. The method as claimed in claim 25, wherein the step of generating at least first and second laser beam pulses is carried out at a high repetition rate, and wherein the method further comprises selecting at least one laser beam pulse through the use of a modulator so as to irradiate the one or more designated links on demand.

28. The method of claim 1, further comprising updating the trajectory during a trajectory segment based on information from at least one of an encoder and an optical sensor, and wherein the step of moving is modified based on the update.

29. The method of claim 28, wherein the optical sensor is an astigmatic dynamic focus sensor.

30. The method of claim 1, further comprising controlling the energy within the one or more pulsed laser beams, wherein both the steps of applying and controlling the energy are carried out using the multi-frequency deflector.

31. The method of claim 1, further comprising updating, during a trajectory segment, a time at which the step of generating is to occur based on trajectory tracking error information.

32. The method of claim 1, wherein the step of irradiating the one or more designated links of the at least one of a row and column is carried out during a non-constant velocity trajectory segment.

33. A system for laser processing a 1D or 2D array of conductive links to remove one or more designated links of the array without damaging a substrate, adjacent non-designated links, or one or more functional layers or levels disposed between the conductive links and the substrate the processing of the one or more conductive links to occur with one or more laser beam pulses in a single pass operation controlled with a positioning subsystem of a laser-based, memory repair system, the positioning subsystem causing relative motion between the conductive links and one or more laser beam spots, the system comprising:

means for obtaining information to identify the one or more designated links of the array and to identify one or more alignment targets about the one or more designated links, each of the one or more alignment targets having a predetermined location relative to the one or more designated links;

means for scanning a measurement beam to obtain one or more signals representative of the locations of the one or more alignment targets and processing the one or more signals to determine the locations of the one or more alignment targets;

means for predicting locations of the one or more designated links relative to the one or more alignment targets, the step of predicting comprising relating the locations of the one or more alignment targets to the locations of the one or more designated links based on at least the pre-determined locations;

a trajectory planner to generate a trajectory plan which positions one or more pulsed laser beams relative to the one or more designated links so that the one or more designated links and the one or more laser beam spots substantially coincide at locations along the centerlines of the one or more pulsed laser beams, and also so that the one or more designated links and the one or more laser beam spots coincide at a time when the one or more laser beam pulses impinge the one or more designated links;

a positioning sub-system for moving the conductive links relative to the centerlines of the one or more pulsed laser beams in accordance with the trajectory plan, the subsystem comprising at least one wafer stage to translate the conductive links along at least one direction;

an optical system providing for an adjustable range of laser beam spot sizes and operable to position the one or more laser beam spots along the centerlines of the one or more pulsed laser beams;

means for generating the one or more laser beam pulses having at least one predetermined characteristic including a pulse width;

a controller that provides at least one control signal to control, based on the at least one frequency from an available range of frequencies, at least one of a pulse location, number of pulses, and spatial spacing of pulses that are to impinge the one or more designated links, the designated links being within a region of the array and along at least one of one or more rows and one or more columns of the array;

a signal generator that accepts the at least one control signal and applies, during overlapping time periods, the at least one frequency to a multi-frequency deflector to produce as an output of said deflector the one or more pulsed laser beams having controlled deflection; and means for focusing the one or more pulsed laser beams to form the corresponding one or more focused spots at the locations of the one or more designated links, wherein the means for focusing provides that the one or more laser beam spots are approximately diffraction limited, the trajectory planner, the signal generator, and the means for focusing thereby precisely positioning the one or more laser beam spots at the locations of the one or more designated links.

34. The system of claim 33, wherein the centerlines of the one or more pulsed laser beams and one or more laser beam spots define an approximate plane of incidence of the one or more pulsed laser beams beams, and wherein the system further comprises a mechanism to orient the plane to cause pulsed laser beams to impinge the one or more designated links of the array along a pre-determined first direction.

35. The system of claim 34, wherein the mechanism comprises a beam rotator comprising a prism and a rotation controller.

* * * * *

UNITED STATES PATENT AND TRADEMARK OFFICE
CERTIFICATE OF CORRECTION

PATENT NO. : 7,394,476 B2 Page 1 of 1
APPLICATION NO. : 11/415547
DATED : July 1, 2008
INVENTOR(S) : Cordingley et al.

It is certified that error appears in the above-identified patent and that said Letters Patent is hereby corrected as shown below:

Page 3, column 30, line 52, please delete "the." and insert -- the --, therefor.

Page 7, column, 32, line 45, please delete "locked." and insert -- locked, --, therefor.

Page 7, column 32, line 50, please delete "the" and insert -- the at least first and second laser beam --, therefor.

Page 9, column 33, line 38, please delete "substrate" and insert -- substrate, --, therefor.

Page 11, column 34, line 51, please delete "beams beams," and insert -- beams, --, therefor.

Signed and Sealed this

First Day of September, 2009

David J. Kappos
*Director of the United States Patent and Trademark Office*